United States Patent [19]

Hirano et al.

[11] Patent Number: 5,771,110
[45] Date of Patent: Jun. 23, 1998

[54] THIN FILM TRANSISTOR DEVICE, DISPLAY DEVICE AND METHOD OF FABRICATING THE SAME

[75] Inventors: Kiichi Hirano; Naoya Sotani, both of Anpachi-gun; Toshifumi Yamaji, Haguri-gun; Yoshihiro Morimoto, Inazawa; Kiyoshi Yoneda, Motosu-gun, all of Japan

[73] Assignee: Sanyo Electric Co., Ltd., Osaka, Japan

[21] Appl. No.: 677,424

[22] Filed: Jul. 2, 1996

[30]     Foreign Application Priority Data

| Jul. 3, 1995 | [JP] | Japan | 7-167513 |
| Aug. 4, 1995 | [JP] | Japan | 7-199979 |
| Aug. 4, 1995 | [JP] | Japan | 7-199980 |
| Aug. 4, 1995 | [JP] | Japan | 7-199981 |
| Aug. 4, 1995 | [JP] | Japan | 7-199982 |

[51] Int. Cl.⁶ ........................ H01L 29/786; H01L 27/105
[52] U.S. Cl. .............................. 257/72; 257/75; 438/491
[58] Field of Search ........................... 257/72, 75, 59, 257/66

[56]     References Cited

U.S. PATENT DOCUMENTS

| 4,822,751 | 4/1989 | Ishizu et al. | 257/72 |
| 4,864,376 | 9/1989 | Aoki et al. | 257/59 |
| 4,948,231 | 8/1990 | Aoki et al. | 257/59 |
| 5,323,042 | 6/1994 | Matsumoto | 257/72 |
| 5,459,346 | 10/1995 | Asakawa et al. | 257/347 |
| 5,563,427 | 10/1996 | Yudasaka et al. | 257/72 |
| 5,576,556 | 11/1996 | Takemura et al. | 257/72 |

FOREIGN PATENT DOCUMENTS 7-176758   7/1995   Japan .

*Primary Examiner*—Gene M. Munson
*Attorney, Agent, or Firm*—Nikaido, Marmelstein, Murray & Oram LLP

[57]     ABSTRACT

A method of fabricating a thin film transistor by setting the temperature of a heat treatment for crystallizing an active layer which is formed on a substrate at a level not deforming the substrate and activating an impurity layer in a heat treatment method different from that employed for the heat treatment, and a semiconductor device prepared by forming a heat absorption film, a semiconductor film, a gate insulating film, and a gate electrode on a substrate, the heat absorption film being provided within a region substantially corresponding to the semiconductor film.

18 Claims, 21 Drawing Sheets

THIN FILM TRANSISTOR DEVICE, DISPLAY DEVICE AND METHOD OF FABRICATING THE SAME

BACKGROUND OF THE INVENTION

1. Field of the Invention

The present invention relates to a semiconductor device such as a thin film transistor (TFT), a method of fabricating the same, a display device such as a liquid crystal display (LCD), and a method of fabricating the same.

2. Description of the Background Art

A thin film transistor (hereinafter referred to as a polycrystalline silicon TFT) employing a polycrystalline silicon film which is formed on a transparent insulating substrate as an active layer is recently being developed as each pixel driving element (pixel driving transistor) for an active matrix LCD.

The polycrystalline silicon TFT advantageously has larger mobility and higher drivability as compared with a thin film transistor employing an amorphous silicon film as an active layer. When such polycrystalline silicon TFTs are employed, therefore, an LCD of high performance LCD can be implemented while not only a pixel part (display part) but a peripheral driving circuit (driver part) can be integrally formed on the same substrate.

In such a polycrystalline silicon TFT, the polycrystalline silicon film for serving as an active layer can be formed by a method of directly depositing the polycrystalline silicon film on the substrate, a method of forming an amorphous silicon film on the substrate and thereafter polycrystallizing the same, or the like.

The method of directly depositing the polycrystalline silicon film on the substrate has a relatively simple step of depositing the film by CVD, for example, under a high temperature, for example.

On the other hand, the amorphous silicon film which is deposited on the substrate is thereafter polycrystallized by solid-phase crystallization in general. This solid-phase crystallization is adapted to polycrystallize the amorphous silicon film in a solid state by performing a heat treatment, for obtaining the polycrystalline silicon film.

An example of such solid-phase crystallization is now described with reference to FIGS. 31 and 32.

Step A (see FIG. 31): An amorphous silicon film is formed on an insulating substrate 51 of quartz glass, for example, by general low pressure CVD, and a heat treatment is performed in a nitrogen ($N_2$) atmosphere at a temperature of about 900° C., thereby solid-phase growing the amorphous silicon film and forming a polycrystalline silicon film 52.

The polycrystalline silicon film 52 is worked into a prescribed shape by photolithography and dry etching by RIE, to be employed as an active layer of a thin film transistor.

A silicon oxide film for serving as a gate insulating film 53 is deposited on the polycrystalline silicon film 52 by low pressure CVD.

Step B (see FIG. 32): A polycrystalline silicon film 55 is deposited on the gate insulating film 53 by low pressure CVD, an impurity is implanted into this polycrystalline silicon film, and a heat treatment is performed for activating the impurity.

Then, a silicon oxide film 54 is deposited on the polycrystalline silicon film by normal pressure CVD, and thereafter the polycrystalline silicon film and the silicon oxide film 54 are worked into prescribed shapes by photolithography and dry etching by RIE. The polycrystalline silicon film is employed as a gate electrode 55.

Then, an impurity is implanted into the polycrystalline silicon film 52 by self alignment through the gate electrode 55 and the silicon oxide film 54 serving as masks, for forming source/drain regions 56.

This method is called a high temperature process since high temperatures of about 900° C. are employed for the solid-phase crystallization and the impurity activation, and has such an advantage that the treatment time can be shortened when a substrate such as a quartz substrate, for example, having a high insulation property is employed.

However, such a substrate having a high insulation property is high-priced, while a relatively low-priced glass substrate unpreferably causes heat distortion. In recent years, therefore, development is generally made in a low temperature process which allows the employment of the glass substrate.

In particular, improvement of performance is indispensable in a TFT which is a driving device. Therefore, various attempts have been made in order to improve the quality of the material forming the TFT and the like through the low temperature process.

For example, a technique of forming a polycrystalline silicon thin film, for example, by excimer laser annealing with a starting material of an amorphous silicon film has been developed as a technique of improving the quality of an active layer material influencing the device characteristics.

However, the laser annealing disadvantageously requires a long time for the crystallization process, since a beam operation must be repeatedly performed. In case of employing only a laser beam as a heat source, the laser annealing requiring a long time must also be performed for activating an impurity region, for example, in addition to the polycrystallization process, and hence the total process time is increased to reduce the throughput of such a TFT device or an LCD device employing the TFT.

SUMMARY OF THE INVENTION

An object of the present invention to enable a low temperature process with employment of a low-priced substrate, for reducing the cost for fabricating a thin film transistor or a liquid crystal display.

Another object of the present invention is to improve the throughput in fabrication of a thin film transistor or a liquid crystal display by fabricating a high-quality polycrystalline silicon film in a short time.

Still another object of the present invention is to fabricate a semiconductor device having excellent quality with a homogeneously activated impurity region.

A further object of the present invention is to fabricate a semiconductor device having a high-quality semiconductor film in a short time.

A further object of the present invention is to provide a display device such as an LCD device having excellent display performance.

A further object of the present invention is to prevent deformation of a substrate in a heat treatment.

A further object of the present invention is to prevent warp and breakage of a substrate in case of employing RTA (rapid thermal annealing) as a heat treatment.

A method of fabricating a thin film transistor according to a first aspect of the present invention is adapted to set the temperature for a heat treatment for crystallizing an active layer which is formed on a substrate is set at a level not deforming the substrate, for example 600°–700° C., for activating an impurity by a heat treatment method which is different from that employed for this heat treatment.

According to the first aspect of the present invention, polycrystallization of an amorphous silicon film and activation of an impurity region can be performed by properly combining the heat treatment method employing a temperature not deforming the substrate, laser annealing and RTA with each other, whereby the fabrication time is shorted as compared with a method of performing both of polycrystallization and activation by laser annealing.

According to a preferred embodiment of the first aspect, the method comprises the steps of forming an amorphous silicon film on an insulating substrate, heat treating the amorphous silicon film by laser annealing or RTA (rapid thermal annealing) employing a temperature not deforming the substrate thereby forming a polycrystalline silicon film, forming a gate electrode on the polycrystalline silicon film through a gate insulating film, forming an impurity region in the polycrystalline silicon film, and activating the impurity region by rapid heating employing RTA or laser annealing.

According to this method, a number of substrates can be simultaneously treated in solid-phase crystallization.

In the first aspect of the present invention, the amorphous silicon film may contain microcrystals. When such an amorphous silicon film containing microcrystals is polycrystallized by solid-phase crystallization, the crystal growth can be completed in a short time.

In the first aspect, the gate electrode may have at least the amorphous silicon film, and may be crystallized by the heat treatment for activating the impurity. In this method, crystallization of the amorphous silicon film and activation of the impurity are performed at once, whereby the treatment time is shortened as compared with a method of performing these operations independently of each other.

In the first aspect, the gate electrode may have a two-layer structure of at least a silicon film and a metal or metal silicide film, and may be reduced in resistance by the heat treatment for activating the impurity. According to this method, reduction of resistance of the two-layer structure of the silicon film and the metal or metal silicide film and activation of the impurity are performed at once, whereby the treatment time is shorted as compared with the case of separately performing these operations.

The gate electrode comprising the two-layer structure of a silicon film and a metal or metal silicide film may be provided so that reduction in resistance of the gate electrode and activation of the impurity region are simultaneously performed by RTA or laser annealing.

In the first aspect, light irradiation heat from a lamp may be employed as a heat source for the RTA. This lamp may be formed by an xenon arc lamp. A heat treatment which is more suitable for activation of the impurity can be performed by employing such a lamp.

A thin film transistor fabricated by the method of fabricating a thin film transistor according to the first aspect of the present invention can be employed as each pixel driving element of a liquid crystal display. Alternatively, the thin film transistor can be employed as each peripheral driving circuit element of the liquid crystal display. Thus, an excellent liquid crystal display can be fabricated in a short time.

A semiconductor device according to a second aspect of the present invention comprises a heat absorption film which is formed on a substrate, a semiconductor film which is formed on the heat absorption film, a gate electrode which is formed on the semiconductor film through a gate insulating film, and an impurity region which is formed in the semiconductor film, and the heat absorption film is provided within a region substantially corresponding to the semiconductor film.

According to the second aspect, a semiconductor device having an impurity region of a homogeneously activated state can be obtained due to the presence of the heat absorption film.

In the second aspect, an insulating film may be provided between the heat absorption film and the semiconductor film.

In the second aspect, the heat absorption film may be provided in a size and within a region substantially corresponding to a channel region in the semiconductor film. Thus, the function of the heat absorption film properly acts on a necessary portion, so that no bad influence is exerted on the remaining portion such as the substrate, for example.

In the second aspect, the heat absorption film may be made of a conductive material such as a metal or metal silicide, or a semiconductor material such as silicon. Thus, the device can be electrostatically shielded against ions which are present in the substrate since the heat absorption film is made of a conductive or semiconductor material.

In the second aspect, the heat absorption film may have a shading property. When the semiconductor device is employed for a display device such as an LCD, the quantity of light directly entering the semiconductor device can be reduced due to the shading property of the heat absorption film.

In the second aspect, the substrate may be a transparent substrate.

The semiconductor device according to the second aspect of the present invention can be employed as at least one of each pixel driving element or each peripheral driving circuit element of a liquid crystal display. Thus, an excellent display device can be obtained.

A method of fabricating a semiconductor device according to a third aspect of the present invention is adapted to provide a semiconductor film for serving as an active layer of a transistor on a substrate through a heat absorption film, and to activate an impurity region provided in the semiconductor film by a heat treatment.

According to the fabrication method of the third aspect, a semiconductor device having an impurity region which is in an excellently and homogeneously activated state can be obtained.

According to a preferred embodiment of the present invention, the method comprises the steps of forming a heat absorption film on a transparent substrate, forming a semiconductor film on the heat absorption film, forming a gate electrode on the semiconductor film through a gate insulating film, forming an impurity region in the semiconductor film, and activating the impurity region by a heat treatment, and the heat absorption film being provided within a region substantially corresponding to the semiconductor film.

According to another preferred embodiment of the present invention, the method comprises the steps of forming a heat absorption film on a transparent substrate, working the heat absorption film into a prescribed shape, covering the heat absorption film with an insulating film, forming a semiconductor film for serving as an active layer of a transistor on the insulating film, forming a gate electrode on the semiconductor film through a gate insulating film, forming an impurity region in the semiconductor film, and activating the impurity region by a heat treatment, and the heat absorption film being provided within a region substantially corresponding to the semiconductor film.

In the third aspect, the semiconductor film may be prepared by polycrystallizing an amorphous silicon film by a heat treatment.

In the third aspect, the heat treatment may be performed by laser annealing.

In the third aspect, the heat absorption film may be made of a conductive material such as a metal or metal silicide, or a semiconductor material such as silicon. The device can be electrostatically shielded against ions which are present in the substrate by preparing the heat absorption film from a conductive or semiconductor material.

The heat absorption film may have a shading property. Thus, the quantity of light directly entering the semiconductor device can be reduced when the semiconductor device is applied to a display device such as an LCD.

RTA may be employed as the heat treatment. In this case, the impurity can be activated in a short time without influencing the substrate.

The heat source for RTA can be formed by a xenon arc lamp. In this case, heat absorption can be efficiently performed.

A semiconductor device fabricated by the method according to the third aspect of the present invention can be employed as at least one of each pixel driving element and each peripheral driving circuit element of a liquid crystal display. Thus, an excellent display device can be fabricated in a short time.

A semiconductor device according to a fourth aspect of the present invention comprises a plurality of semiconductor elements which are integrated on a substrate. Heat absorption films are provided between the substrate and the semiconductor elements, and an area or film thickness of each heat absorption film is relatively reduced in a portion where a relatively large number of the semiconductor elements are provided, while an area or film thickness of each heat absorption film is relatively increased in a portion where a relatively small number of the semiconductor elements are provided, in accordance with the distributed state of the semiconductor elements on the substrate.

According to a preferred embodiment of the fourth aspect, a plurality of semiconductor switching elements are integrated on a substrate, and each semiconductor switching element comprises a heat absorption film which is formed on the substrate, a semiconductor film which is formed on the heat absorption film, a gate electrode which is formed on the semiconductor film through a gate insulating film, and an impurity region which is formed in the semiconductor film. An area or film thickness of each heat absorption film is relatively reduced in a portion where a relatively large number of the semiconductor switching elements are provided, while an area or film thickness of each heat absorption film is relatively increased in a portion where a relatively small number of the semiconductor switching elements are provided, in accordance with the distributed state of the semiconductor switching elements on the substrate.

In the fourth aspect, the heat absorption effects of the heat absorption films can be adjusted by changing the areas and/or the thicknesses of the heat absorption films.

In the fourth aspect, the heat absorption effects of the heat absorption films can be adjusted by providing semiconductor switching elements having no heat absorption films and changing the ratio of presence of such semiconductor switching elements.

Each of the heat absorption films in the fourth aspect can be prepared from a film which is similar to those according to the second and third aspects.

A display device according to the fourth aspect of the present invention is a driver-integrated display device comprising a pixel part and a peripheral driving circuit part which are formed on the same substrate. This display device comprises pixel driving elements which are provided in the pixel part and peripheral driving circuit elements which are provided in the peripheral driving circuit part, and the pixel driving elements and the peripheral driving circuit elements are formed by semiconductor switching elements. Each semiconductor switching element comprises a heat absorption film which is formed on the substrate, a semiconductor film which is formed on the heat absorption film, a gate electrode which is formed on the semiconductor film through a gate insulating film, and an impurity region which is formed on the semiconductor film. A ratio of area or film thickness of the heat absorption film relative to the semiconductor film in the pixel part is adjusted to be larger than that of the heat absorption film in the peripheral driving circuit part.

The pixel part and the peripheral driving circuit part can be provided on one of a pair of substrates which are opposed to each other through a liquid crystal layer. Each of the heat absorption films can be formed by a film which is similar to those of the second and third aspects.

The heat absorption effects of the heat absorption films can be adjusted by changing the areas or thicknesses of the heat absorption films.

Alternatively, the heat absorption effects of the heat absorption films can be adjusted by providing semiconductor switching elements having no heat absorption films and changing the ratio of presence of these semiconductor switching elements.

A method of fabricating a semiconductor device according to a fifth aspect of the present invention employs RTA for a heat treatment in a process of forming a semiconductor element on a substrate, and heating by RTA is performed in a plurality of times, while the heating temperature is increased stepwise from the initial time toward the final time.

According to a preferred embodiment of the fifth aspect, the fabrication method comprises the steps of forming a semiconductor film on a substrate, forming a gate electrode on the semiconductor film through a gate insulating film, forming an impurity region in the semiconductor film, and activating the impurity region by a heat treatment through RTA, while heating by RTA is performed a plurality of times and the heating temperature is increased stepwise from the initial time toward the final time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
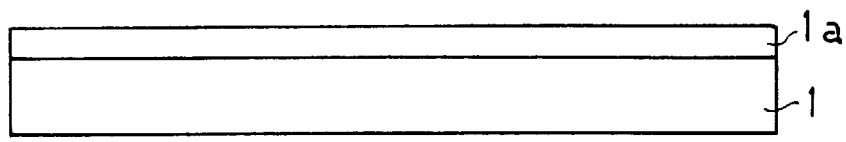
FIG. 1 is a sectional view for illustrating a fabrication step in a first embodiment according to the first aspect of the present invention.
Figure 2:
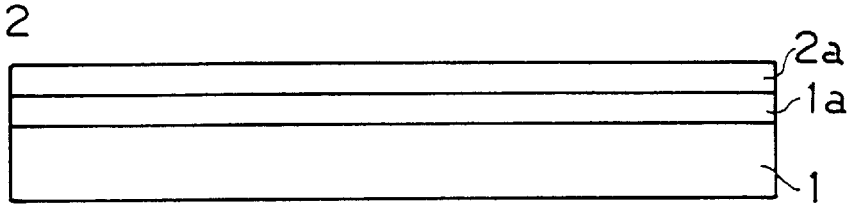
FIG. 2 is a sectional view for illustrating a fabrication step in the first embodiment according to the first aspect of the present invention.
Figure 3:
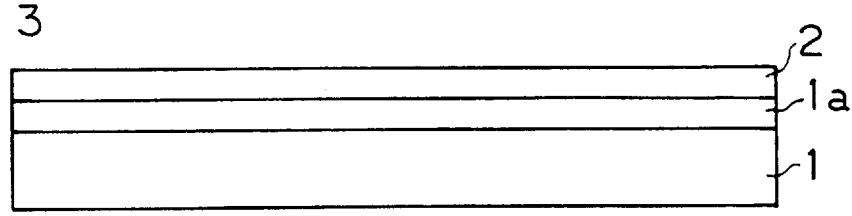
FIG. 3 is a sectional view for illustrating a fabrication step in the first embodiment according to the first aspect of the present invention.
Figure 4:
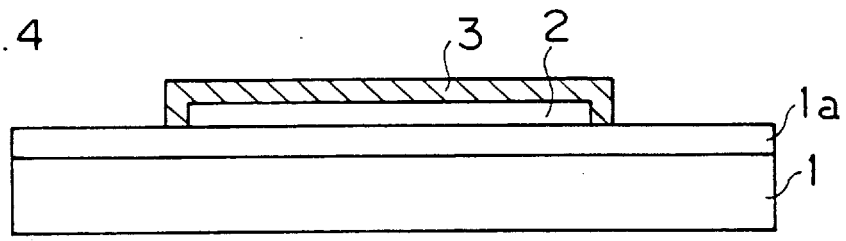
FIG. 4 is a sectional view for illustrating a fabrication step in the first embodiment according to the first aspect of the present invention.
Figure 5:
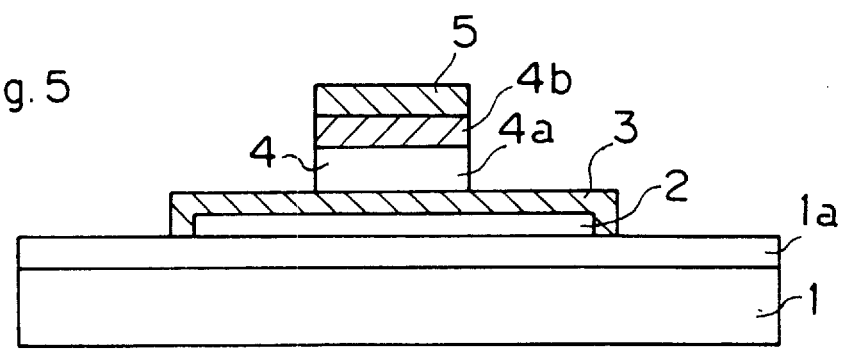
FIG. 5 is a sectional view for illustrating a fabrication step in the first embodiment according to the first aspect of the present invention.
Figure 6:
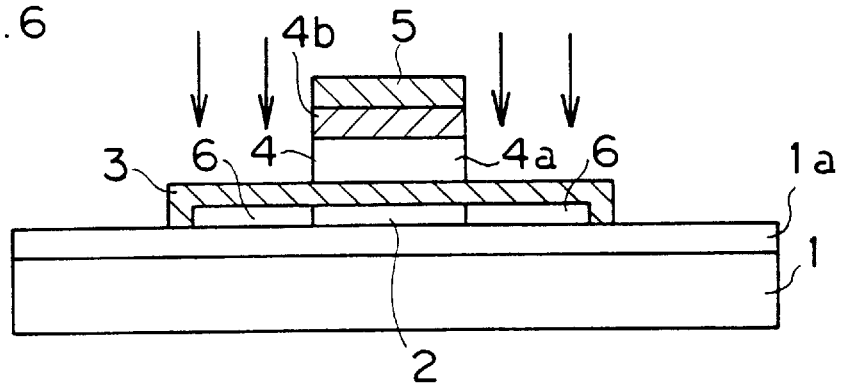
FIG. 6 is a sectional view for illustrating a fabrication step in the first embodiment according to the first aspect of the present invention.
Figure 7:
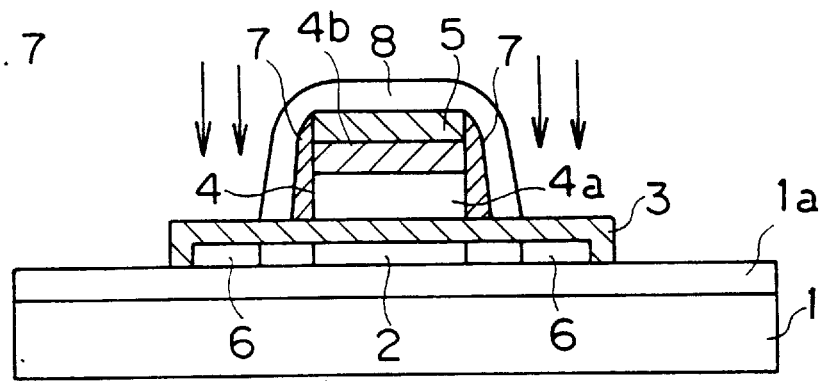
FIG. 7 is a sectional view for illustrating a fabrication step in the first embodiment according to the first aspect of the present invention.
Figure 8:
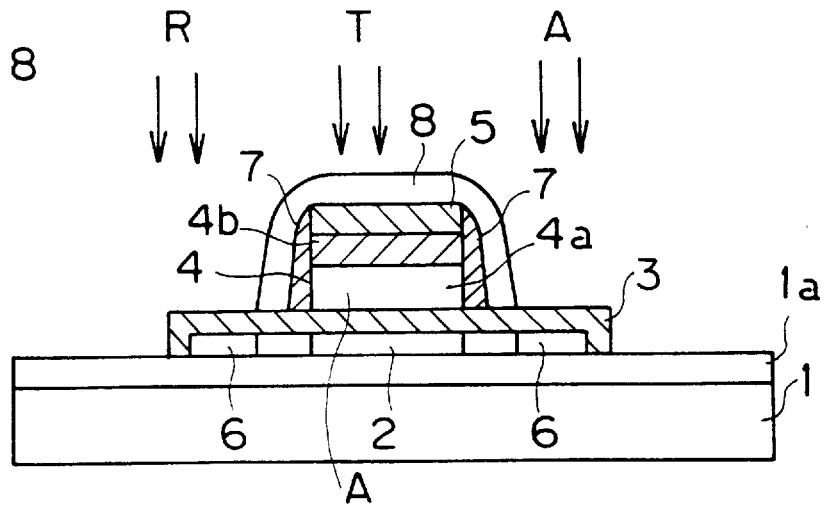
FIG. 8 is a sectional view for illustrating a fabrication step in the first embodiment according to the first aspect of the present invention.
Figure 9:
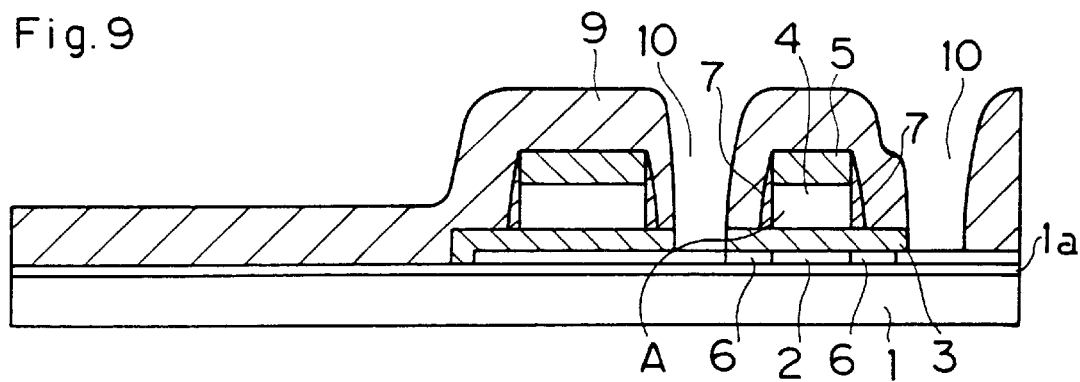
FIG. 9 is a sectional view for illustrating a fabrication step in the first embodiment according to the first aspect of the present invention.
Figure 10:
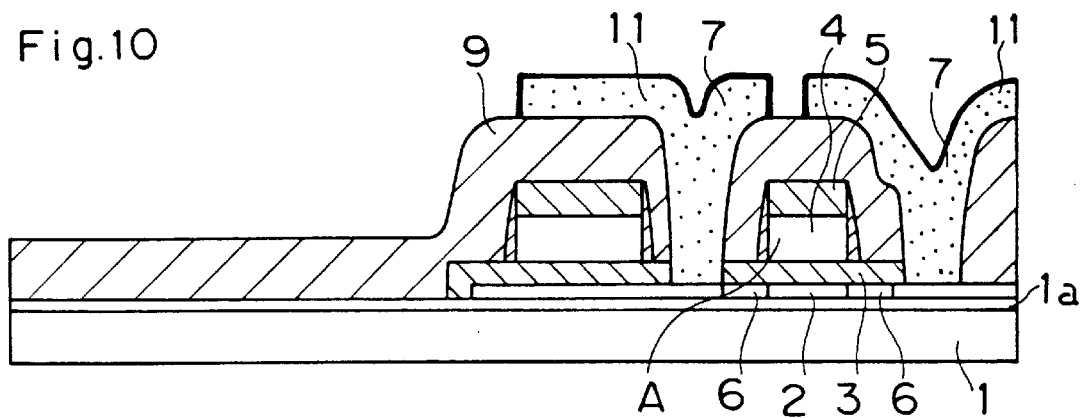
FIG. 10 is a sectional view for illustrating a fabrication step in the first embodiment according to the first aspect of the present invention.
Figure 11:
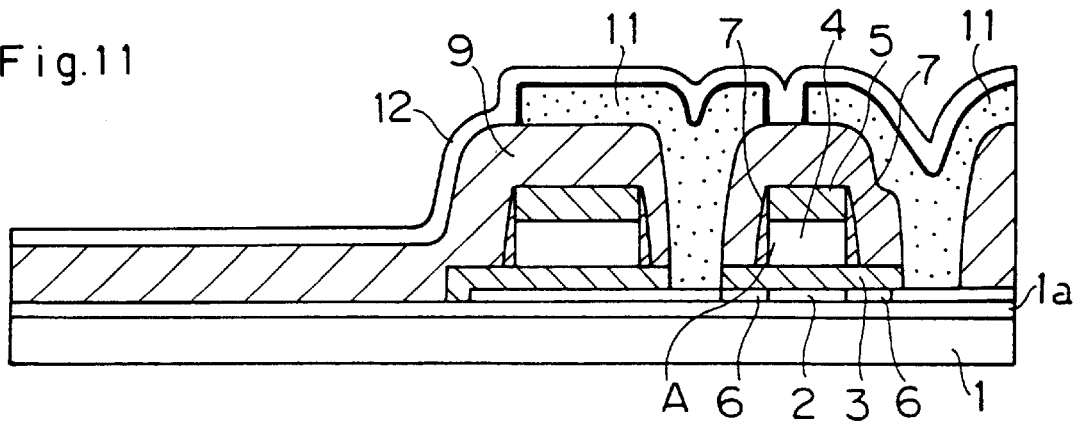
FIG. 11 is a sectional view for illustrating a fabrication step in the first embodiment according to the first aspect of the present invention.
Figure 12:
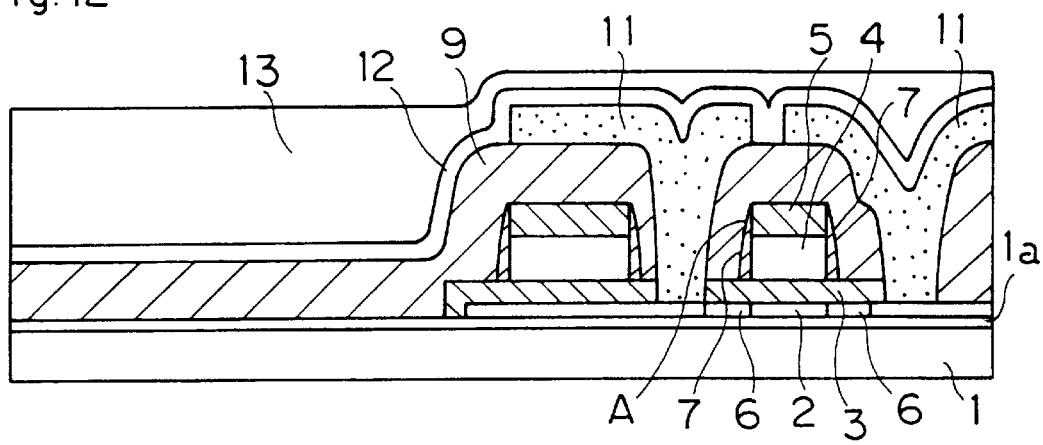
FIG. 12 is a sectional view for illustrating a fabrication step in the first embodiment according to the first aspect of the present invention.
Figure 13:
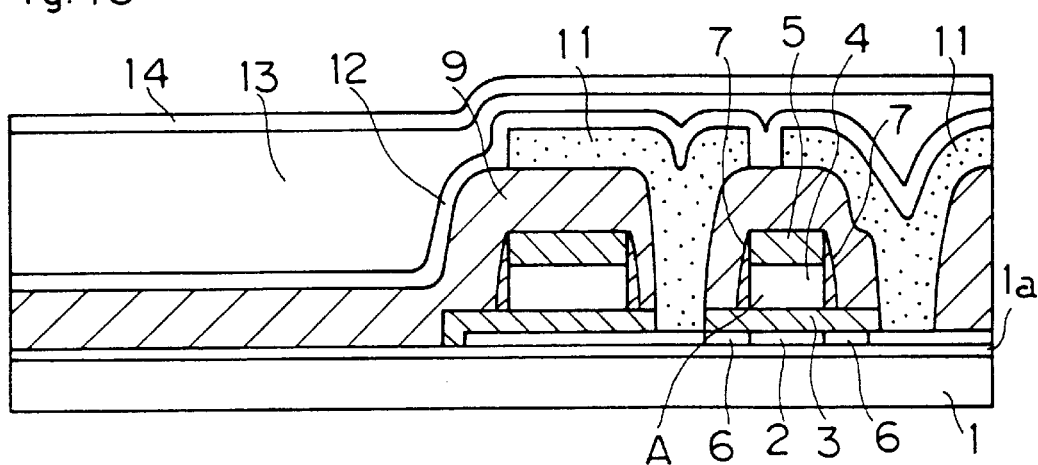
FIG. 13 is a sectional view for illustrating a fabrication step in the first embodiment according to the first aspect of the present invention.
Figure 14:
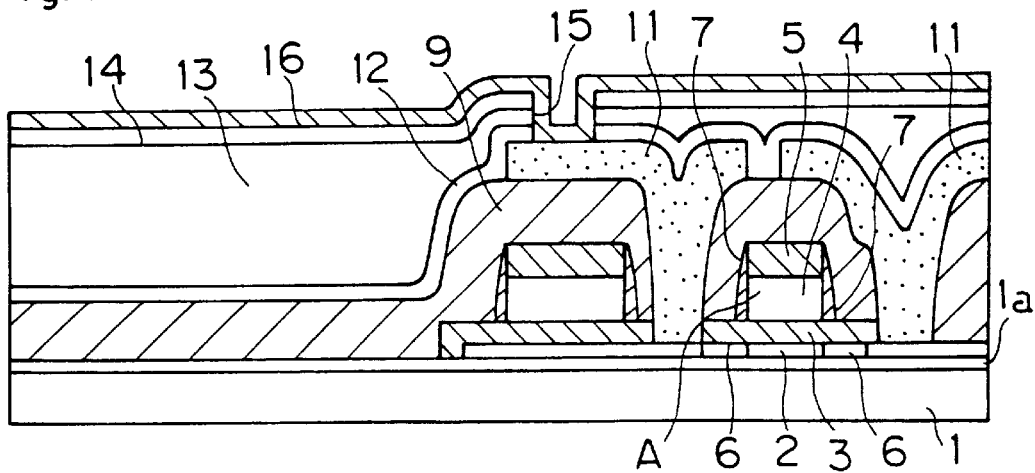
FIG. 14 is a sectional view for illustrating a fabrication step in the first embodiment according to the first aspect of the present invention.
Figure 15:
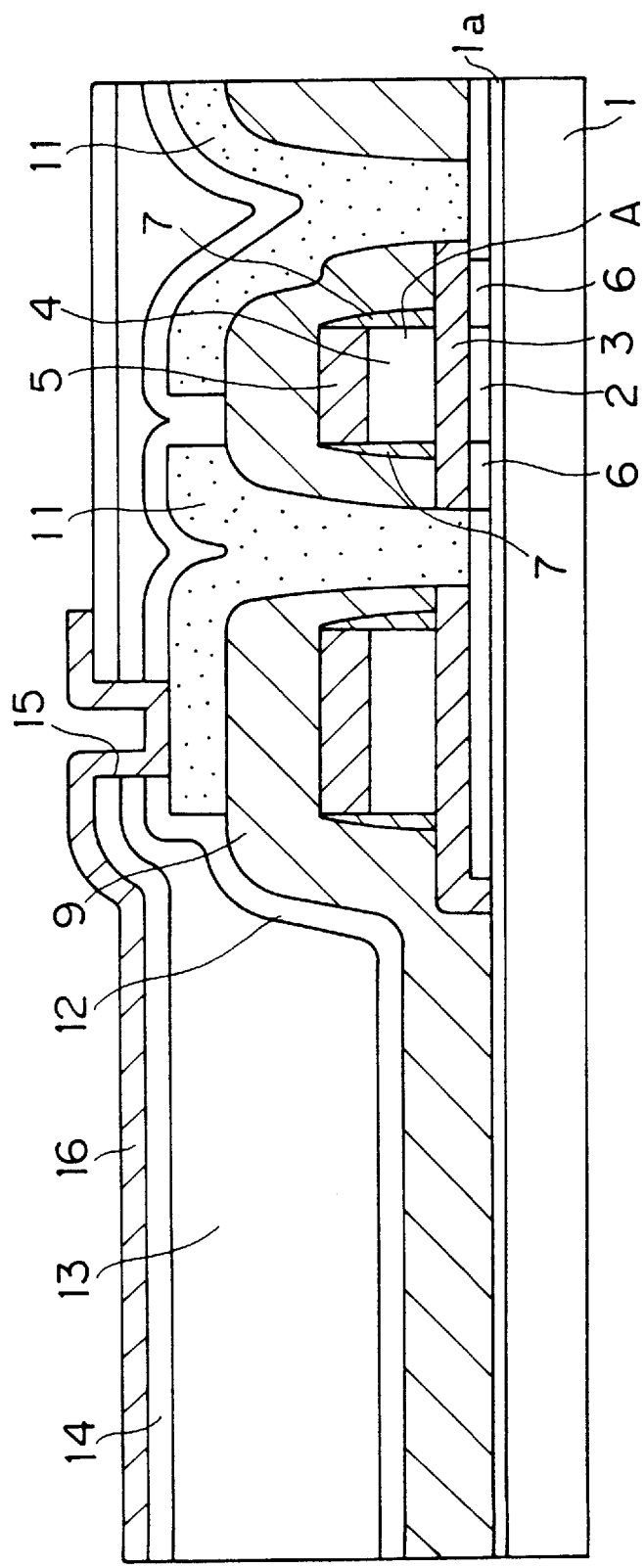
FIG. 15 is a sectional view for illustrating a fabrication step in the first embodiment according to the first aspect of the present invention.
Figure 16:
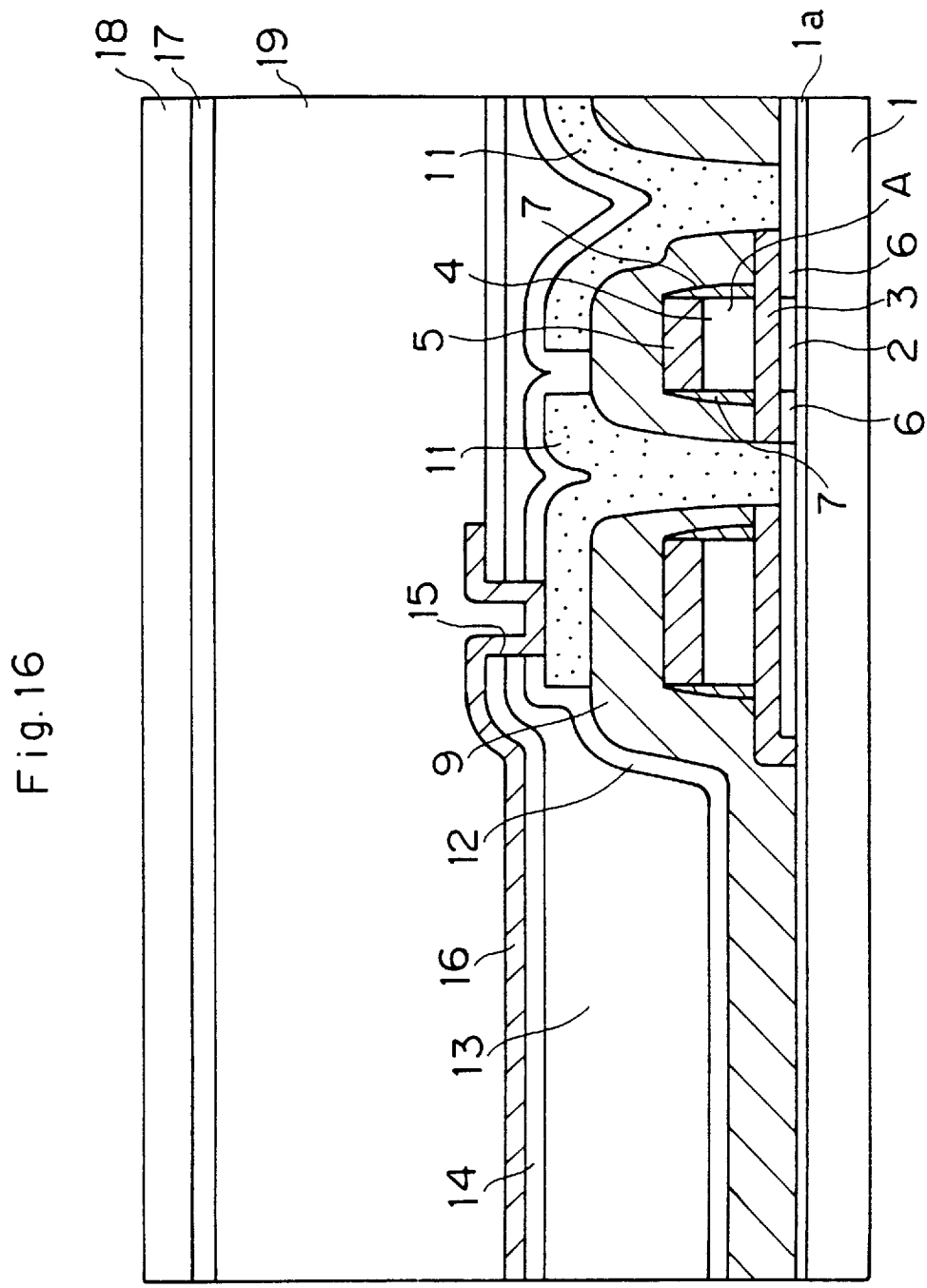
FIG. 16 is a sectional view for illustrating a fabrication step in the first embodiment according to the first aspect of the present invention.

A first embodiment according to the first aspect of the present invention is now described with reference to FIGS. 1 to 18.

Step 1 (see FIG. 1): An insulating thin film 1a of $SiO_2$ or SiN is formed on a substrate 1 of quartz glass or no-alkali glass by CVD or sputtering. In the concrete, the substrate 1 is prepared from 7059 by Corning Inc., and an $SiO_2$ film of 3000 to 5000 Å in thickness is formed on its surface at a formation temperature of 350° C. by normal or low pressure CVD.

This $SiO_2$ film must have such a thickness that no impurity passes through the $SiO_2$ film to diffuse into an upper layer from the substrate 1 in a later step of a heat treatment or irradiation with a beam. This thickness is properly selected in the range of 1000 to 6000 Å, and an excellent diffusion preventing effect can be attained when the thickness is in the range of 2000 to 6000 Å, most properly in the range of 2000 to 3000 Å.

When the insulating thin film 1a is prepared from SiN, on the other hand, the thickness of this film is properly selected in the range of 1000 to 5000 Å, and an excellent diffusion preventing effect can be attained when the thickness is in the range of 2000 to 5000 Å, most properly in the range of 2000 to 3000 Å.

Step 2 (see FIG. 2): An amorphous silicon film 2a of 500 Å in thickness is formed on the insulating thin film 1a. When the amorphous silicon film 2a is employed as an active layer of a polycrystalline TFT, the OFF-state current of the TFT is increased if the thickness of the active layer is too large while the ON-state current is reduced if the thickness is too small. Therefore, the thickness of the amorphous silicon film 2a is properly selected in the range of 400 to 800 Å, and excellent characteristics are attained when the thickness is in the range of 500 to 700 Å, most properly in the range of 500 to 600 Å.

The amorphous silicon film 2a is formed in the following manner:

(1) With employment of low pressure CVD: In order to form the amorphous silicon film 2a by low pressure CVD, thermal decomposition of monosilane ($SiH_4$) or disilane ($Si_2H_6$) is employed. When monosilane is employed, the film becomes amorphous when the treatment temperature is not more than 550° C., or becomes polycrystalline when the treatment temperature is in excess of 620° C. In the treatment temperature range of 550° to 620° C., the ratio of amorphous materials including microcrystals is increased, while the film approaches an amorphous state and the ratio of the microcrystals is reduced as the temperature is reduced. Thus, the amount of microcrystals contained in the amorphous silicon film 2a can be adjusted by simply changing the temperature condition.

(2) With employment of plasma CVD: In order to form the amorphous silicon film 2a by plasma CVD, thermal decomposition of monosilane or disilane in a plasma is employed.

In practice, plasma CVD is employed for forming an amorphous silicon film containing no microcrystals with employment of monosilane gas under a temperature of 350° C.

Step 3 (see FIG. 3): The surface of the amorphous silicon film 2a is irradiated and scanned with a KrF excimer laser beam having a wavelength $\lambda$ of 248 nm to be annealed, melted and recrystallized for forming a polycrystalline silicon thin film 2.

The laser conditions for this step are an annealing atmosphere of not more than $1\times10^{-4}$ Pa, a substrate temperature in the range of the room temperature to 600° C., irradiation energy density of 100 to 500 $mJ/cm^2$, and a scanning rate of 1 to 10 mm/sec. (in practice, the film can be scanned at a rate in the range of 0.1 to 100 mm/sec.).

The KrF laser beam may be replaced with an XeCl excimer laser beam having a wavelength $\lambda$ of 308 nm. In this case, the laser conditions are an annealing atmosphere of not more than $1\times10^{-4}$ Pa, a substrate temperature in the range of the room temperature to 600° C., irradiation energy density of 100 to 500 $mJ/cm^2$, and a scanning rate of 1 to 10 mm/sec. (in practice, the film can be scanned at a rate in the range of 0.1 to 100 mm/sec.).

Alternatively, an ArF excimer laser beam having a wavelength $\lambda$ of 193 nm may be employed. In this case, the laser conditions are an annealing atmosphere of not more than $1\times10^{-4}$ Pa, a substrate temperature in the range of the room temperature to 600° C., irradiation energy density of 100 to 500 $mJ/cm^2$, and a scanning rate of 1 to 10 mm/sec.

In any case, the grain size of polycrystalline silicon is increased in proportion to the irradiation energy density and the number of irradiation times, and hence the energy density and the number of irradiation times may be adjusted to attain a desired grain size.

Figure 29:
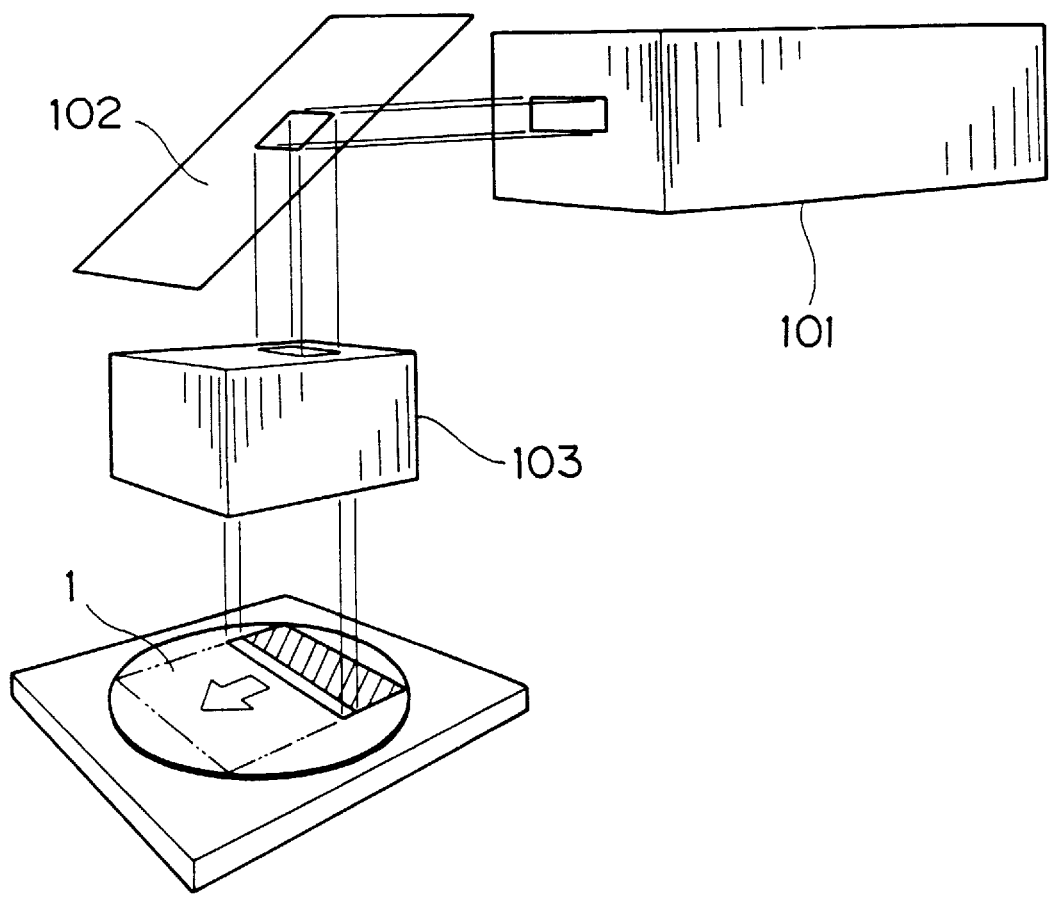
FIG. 29 is a block diagram showing an excimer laser annealing device.

According to this embodiment, high throughput laser irradiation is employed for the excimer laser annealing. Referring to FIG. 29, numeral 101 denotes a KrF excimer laser unit, numeral 102 denotes a reflecting mirror for reflecting a laser beam from the laser unit 101, and numeral 103 denotes a laser beam control optical system for working the laser beam received from the reflecting mirror 102 into a prescribed state and applying the same to a substrate 1.

In such a structure, the high throughput laser irradiation is adapted to apply the laser beam which is worked in the form of a sheet of 150 mm by 0.5 mm by the laser beam control optical system 103 by superposing a plurality of pulses with each other, for completely synchronizing stage scanning with pulse laser irradiation and irradiating the substrate with the laser beam in superposition of extremely high accuracy, thereby improving the throughput.

Step 4 (see FIG. 4): The polycrystalline silicon film 2 is worked into a prescribed shape by photolithography and dry etching by RIE, to be employed as an active layer of a thin film transistor.

Then, an LTO film (low temperature oxide film: silicon oxide film) 3 of 1000 Å in thickness for serving as a gate insulating film is formed on the polycrystalline silicon film 2 by low pressure CVD through a load locking low pressure CVD apparatus.

Step 5 (see FIG. 5): An amorphous silicon film 4a of 2000 Å in thickness is deposited on the gate insulating film 3 by low pressure CVD. This amorphous silicon film 4a is doped with an impurity (arsenic or phosphorus serving as an N-type impurity, or boron serving as a P-type impurity) in formation thereof. Alternatively, the film 4a may be deposited in a non-doped state, so that the impurity is thereafter implanted into the same.

Then, a tungsten silicide ($WSi_x$) film 4b of 1000 Å in thickness is formed on the amorphous silicon film 4a by sputtering. In the sputtering an alloy target of W silicide is employed. While the stoichiometric composition of W silicide ($WSi_x$) is X=2, the composition of the alloy target is set at X>2. If the composition of the W silicide film 4b is close to X=2, extremely high tensile stress takes place in a later treatment step and the W silicide film 4b may be cracked or separated. However, the resistance value of W silicide is minimized in case of X=2, and hence the upper limit of X must be set to cause neither cracking nor separation.

A silicon oxide film 5 is deposited on the W silicide film 4b by normal pressure CVD, and thereafter the polycrystalline silicon film 4a, the W silicide film 4b and the silicon oxide film 5 are worked into prescribed shapes by photolithography and dry etching by RIE. The amorphous silicon film 4a is employed as a gate electrode 4 of a polycide structure, along with the W silicide film 4b.

Step 6 (see FIG. 6): An impurity is implanted into the polycrystalline silicon film 2 by self alignment through the gate electrode 4 and the silicon oxide film 5 serving as masks, thereby forming source/drain regions 6.

Step 7 (see FIG. 7): A silicon oxide film is deposited on the gate insulating film 3 and the silicon oxide film 5 by normal pressure CVD and anisotropically etched back overall, thereby forming side walls 7 on side portions of the gate electrode 4 and the silicon oxide film 5. Further, the side walls 7 and the silicon oxide film 5 are covered with a resist film 8, and an impurity is implanted into the polycrystalline silicon film 2 again by self alignment through the resist film 8 serving as a mask, thereby forming an LDD (lightly doped drain) structure.

Step 8 (see FIG. 8): In this state, rapid heating is performed by RTA (rapid thermal annealing).

Figure 30:
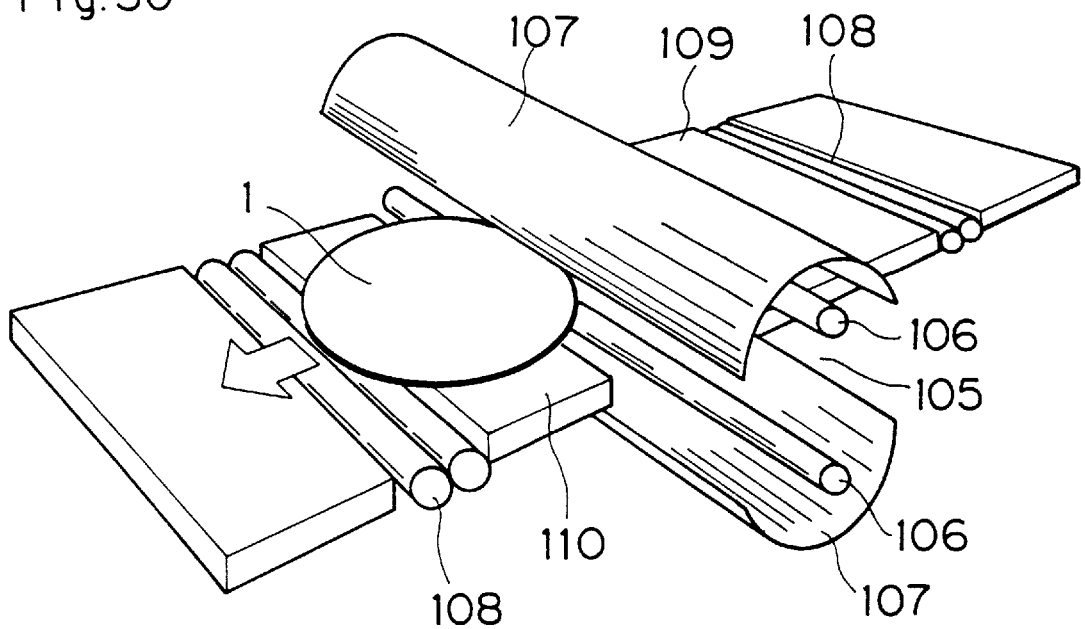
FIG. 30 is a block diagram of an RTA device.
Figure 31:
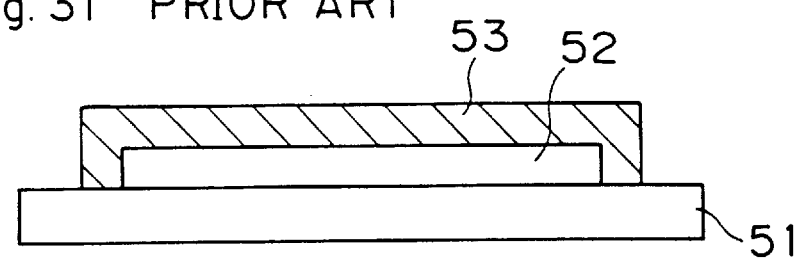
FIG. 31 is a sectional view showing an exemplary conventional fabrication step.
Figure 32:
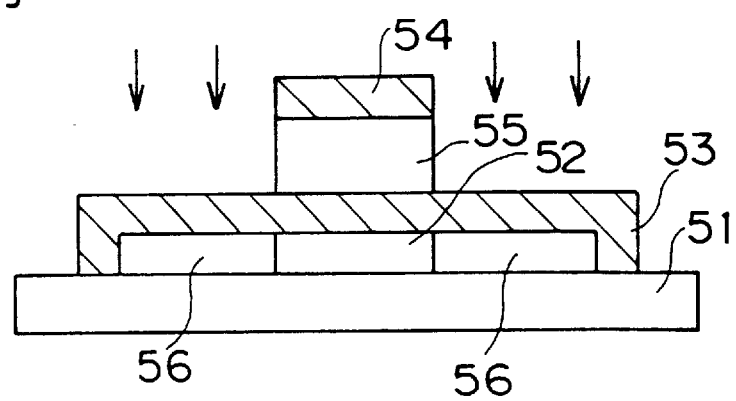
FIG. 32 is a sectional view showing an exemplary conventional fabrication step.
Figure 33:
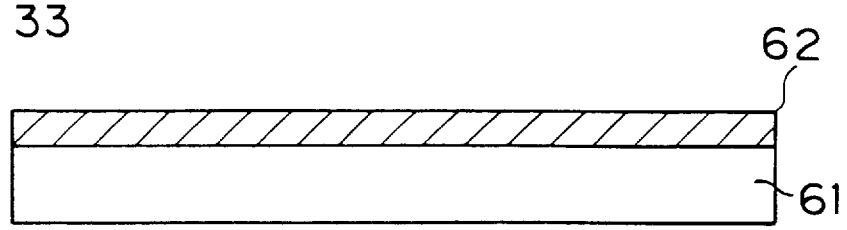
FIG. 33 is a sectional view for illustrating a fabrication step in an embodiment according to the second to fifth aspects of the present invention.
Figure 34:
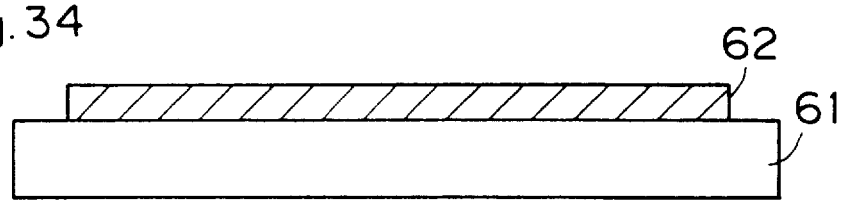
FIG. 34 is a sectional view for illustrating a fabrication step in the embodiment according to the second to fifth aspects of the present invention.
Figure 35:
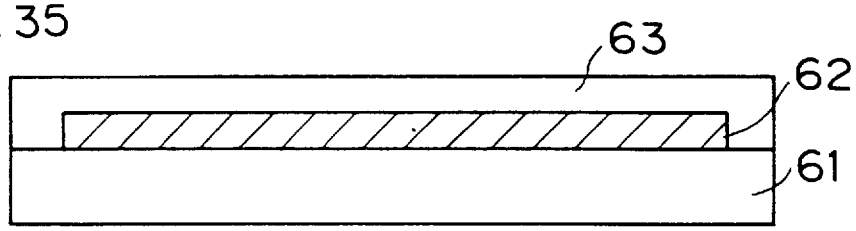
FIG. 35 is a sectional view for illustrating a fabrication step in the embodiment according to the second to fifth aspects of the present invention.
Figure 36:
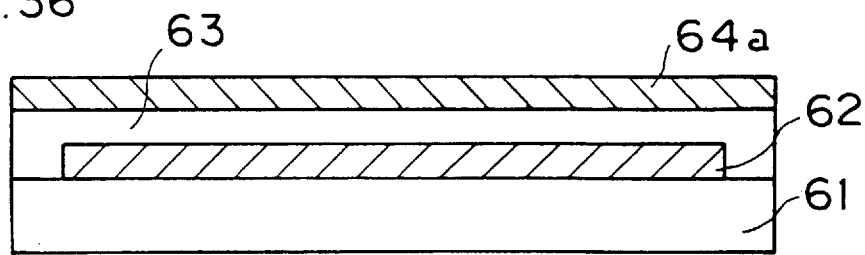
FIG. 36 is a sectional view for illustrating a fabrication step in the embodiment according to the second to fifth aspects of the present invention.
Figure 37:
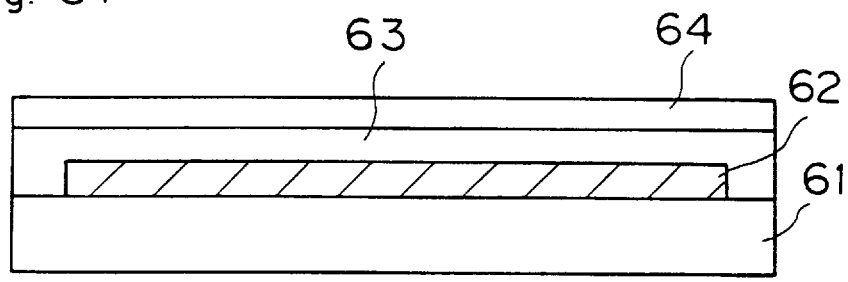
FIG. 37 is a sectional view for illustrating a fabrication step in the embodiment according to the second to fifth aspects of the present invention.
Figure 38:
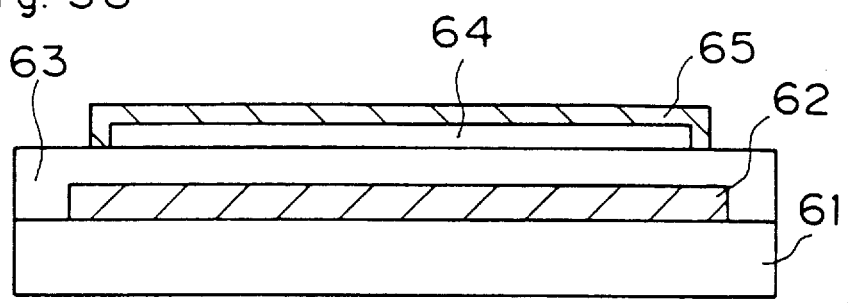
FIG. 38 is a sectional view for illustrating a fabrication step in the embodiment according to the second to fifth aspects of the present invention.
Figure 39:
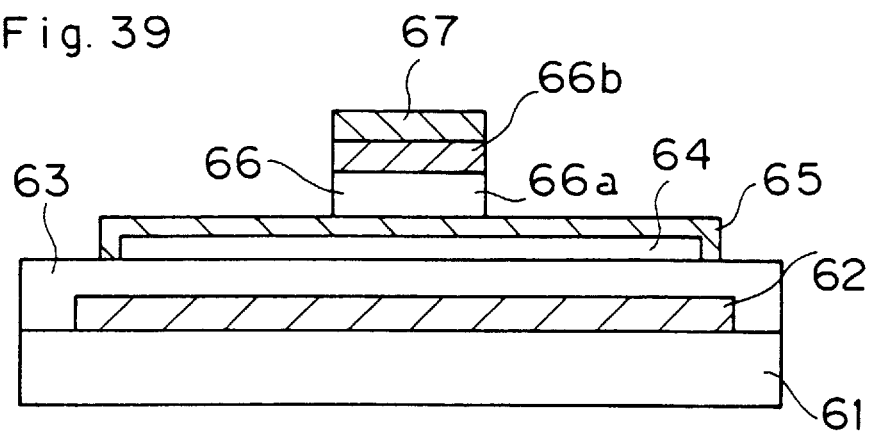
FIG. 39 is a sectional view for illustrating a fabrication step in the embodiment according to the second to fifth aspects of the present invention.
Figure 40:
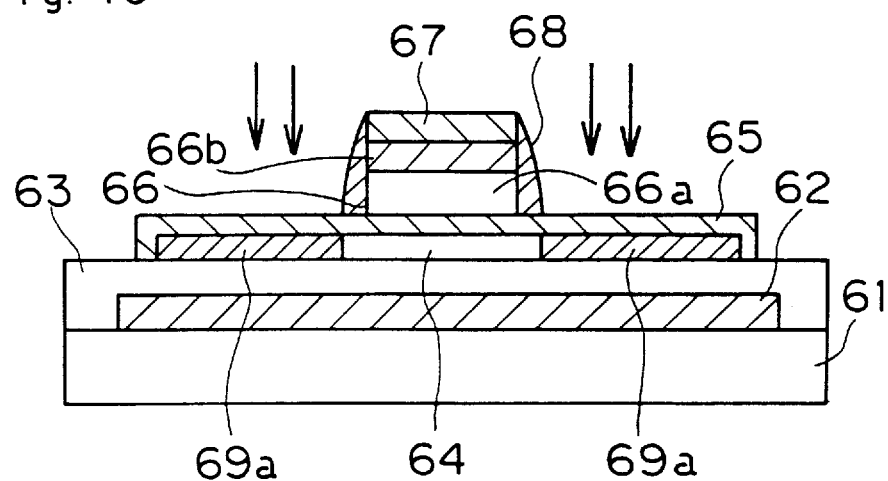
FIG. 40 is a sectional view for illustrating a fabrication step in the embodiment according to the second to fifth aspects of the present invention.
Figure 41:
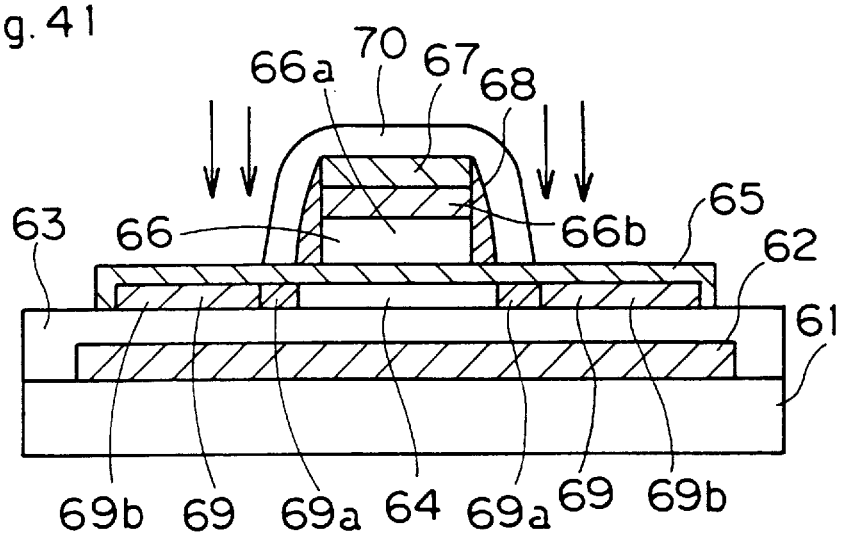
FIG. 41 is a sectional view for illustrating a fabrication step in the embodiment according to the second to fifth aspects of the present invention.
Figure 42:
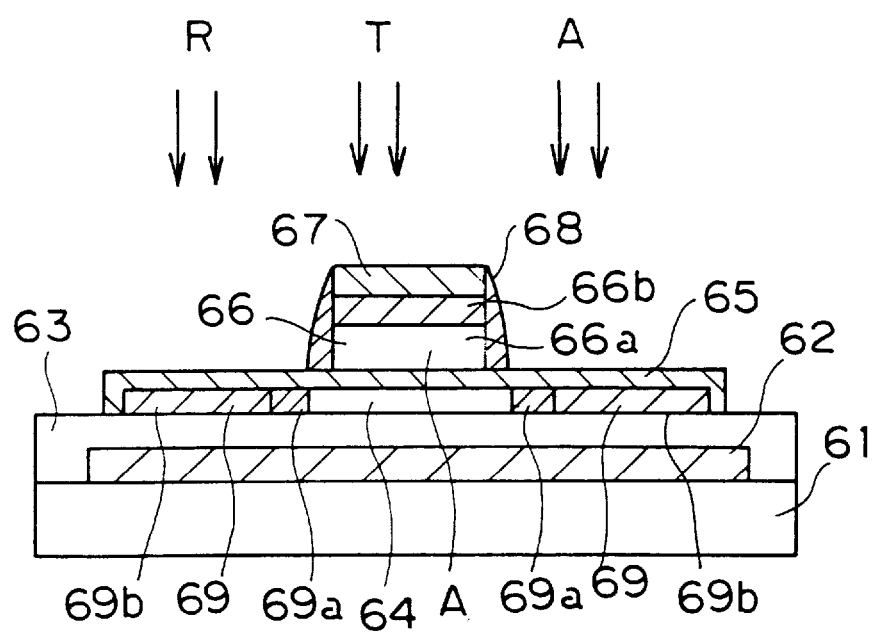
FIG. 42 is a sectional view for illustrating a fabrication step in the embodiment according to the second to fifth aspects of the present invention.

Referring to FIG. 30, numeral 105 denotes a heat source for emitting sheet-type annealing light, which is formed by vertically opposing a pair of xenon (Xe) arc lamps 106 and a pair of reflecting mirrors 107 covering the same to each other. Numeral 108 denotes rollers for carrying a substrate 1, numeral 109 denotes a preheater for preheating, and numeral 110 denotes an auxiliary heater for preventing the heated substrate 1 from being cracked by abrupt cooling.

In such a structure, the substrate 1 is preheated by the preheater 109, and thereafter heat treated through the sheet type annealing light source 105.

The RTA conditions for this operation are a heat source of an Xe arc lamp, a temperature of 700° to 950° C. (pyrometer indicated value), an $N_2$ atmosphere, and a time of 1 to 3 seconds. Although the heating by RTA is performed at a high temperature, this step can be completed in an extremely short time and hence the substrate 1 is not deformed.

In order to avoid abrupt application of a high temperature to the substrate 1, RTA may be performed a plurality of times. In this case, RTA is performed for 1 to 3 seconds every time, and the temperature is increased stepwise from 400° C. for the initial time to 700° to 950° C. for the final time.

The light heat from the Xe arc lamp is more strongly absorbed in an amorphous part and a silicide part as compared with a polycrystalline part, and hence only necessary portions can be selectively heated. Thus, this step is suitable for reducing the resistance of a (gate) wire and activating the impurity.

Due to the rapid heating, the impurity in the source/drain regions 6 is activated and the amorphous silicon film 4a is polycrystallized, while the sheet resistance of the gate electrode 4 in a polycide structure by the polycrystalline silicon film 4a and the W silicide film 4b is reduced to about 20 to 22 Ω/□.

Further, the sheet resistance of the activated source/drain regions 6 is also reduced to 1 to 1.5 kΩ/□ in case of an N type or 1 to 1.2 kΩ/□ in case of a P type, equivalently to a high temperature heat treatment by a diffusion furnace employed in a high temperature process.

A thin film transistor (TFT) A is formed through this step.

Step 9 (see FIG. 9): The resist film 8 is removed, and thereafter an interlayer insulating film 9 consisting of a layered structure of a plasma oxide film of 2000 Å in thickness and a silicon oxide film of 2000 Å formed by normal CVD is formed on the overall surface of the device. If the interlayer insulating film 9 is formed only by the silicon oxide film by normal CVD, the deposition thickness may be so inhomogeneous that overhangs are formed and Al etc. employed in a later step is not removed but tends to remain to cause imperfect insulation. When the silicon oxide film is deposited under the normal pressure after deposition of the plasma oxide film according to this embodiment, on the other hand, the growth rate of the silicon oxide film is stabilized and its deposition thickness is homogenous.

In particular, the plasma oxide film is deposited in a homogeneous thickness along the irregularity of the substrate surface, whereby the total thickness of the interlayer insulating film 9 is homogeneously stabilized.

The deposition conditions for the plasma oxide film are a deposition temperature of 390° C., an RF output of 500 W, an $SiH_4$ flow rate of 500 sccm, an oxygen flow rate of 1500 sccm and a pressure of 9 Torr, and those for the silicon oxide film deposition by normal pressure CVD are a deposition temperature of 400° C., and a carrier $N_2$ gas flow rate of 3000 cc.

Then, the device is heated in a hydrogen ($H_2$) atmosphere at a temperature of 450° C. for 12 hours, and further subjected to a hydrogen plasma treatment. Due to such hydrogenation, hydrogen atoms are bonded to crystal defect portions of the polycrystalline silicon film so that the crystal structure is stabilized and field effect mobility is improved.

Thereafter contact holes 10 are formed in the interlayer insulating film 9 by photolithography and dry etching by RIE, to be in contact with the source/drain regions 6.

Step 10 (see FIG. 10): A wiring layer consisting of a layered structure of Ti/Al—Si alloy/Ti is deposited by magnetron sputtering, and worked into source/drain electrodes 11 by photolithography and dry etching by RIE.

Step 11 (see FIG. 11): A silicon oxide film (or a silicon nitride film) 12 for serving as a protective layer is thinly deposited on the overall surface of the device by CVD.

Step 12 (see FIG. 12): An SOG (spin on glass) film 13 is applied onto the overall surface of the device three times, for flattening the irregular surface of the device.

Step 13 (see FIG. 13): Since the SOG film 13 has inferior resist separability and tends to absorb moisture, a silicon oxide film (or a silicon nitride film) 14 is further thinly deposited on the SOG film 13 by CVD, for serving as a protective layer.

Step 14 (see FIG. 14): A contact hole 15 communicating with the source/drain electrodes 11 is formed in the silicon oxide film 12, the SOG film 13 and the silicon oxide film 14 by photolithography and dry etching by RIE, and an ITO (indium tin oxide) film 16 for serving as a pixel electrode is deposited on the overall surface of the device by sputtering.

Step 15 (see FIG. 15): In order to finally work the ITO film 16 into an electrode shape, a resist pattern is formed on the ITO film 16, which in turn is etched by RIE employing hydrogen bromide gas (HBr), and the gas is switched to chlorine gas ($Cl_2$) when exposure of the silicon oxide film 14 is started, for continuously performing the etching to the last as such.

Step 16 (see FIG. 16): After one TFT substrate of an LCD is formed in the aforementioned manner, a transparent insulating substrate 18 which is provided with a common electrode 17 on its surface is opposed thereto and a liquid crystal layer 19 is formed by sealing liquid crystals between the substrates 1 and 18, thereby completing a pixel part 20 of the LCD.

Figure 17:
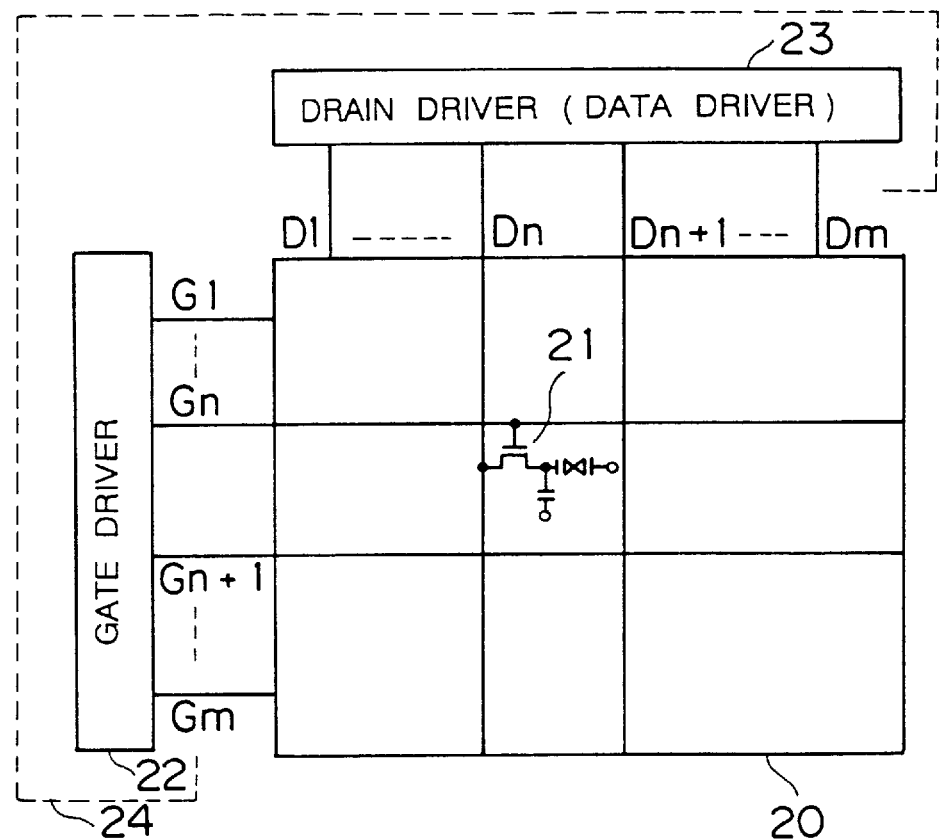
FIG. 17 is a block diagram showing an active matrix LCD.

FIG. 17 is a block diagram showing an active matrix LCD in this embodiment.

Scanning lines (gate wires) G1 . . . Gn, Gn+1 . . . Gm and data lines (drain wires) D1 . . . Dn, Dn+1 . . . Dm are arranged on the pixel part 20. The gate wires and the drain wires intersect with each other, so that pixels 21 are provided on the intersections. The gate wires are connected to a gate driver 22, so that gate signals (scan signals) are applied thereto. On the other hand, the drain wires are connected to a drain driver (data driver) 23, so that data signals (video signals) are applied thereto. These drivers 22 and 23 form a peripheral driving circuit 24.

An LCD prepared by forming at least one of the drivers 22 and 23 on the same substrate as the pixel part 20 is generally called a driver-integrated LCD (LCD having built-in drivers). In this LCD, the gate driver 22 or the drain driver 23 may be provided on each end of the pixel part 20.

A polycrystalline silicon TFT which is prepared in a similar manner to the polycrystalline silicon TFT (A) is employed also as each switching element of the peripheral driving circuit 24, and this TFT is formed on the same substrate in parallel with preparation of the polycrystalline TFT (A). The polycrystalline silicon TFT for the peripheral driving circuit 24 is not in an LDD structure, but in a general single drain structure. However, this polycrystalline silicon TFT may alternatively have the LDD structure, as a matter of course.

The polycrystalline silicon TFT of the peripheral driving circuit 24 is formed in a CMOS structure, thereby implementing dimensional reduction of the drivers 22 and 23.

Figure 18:
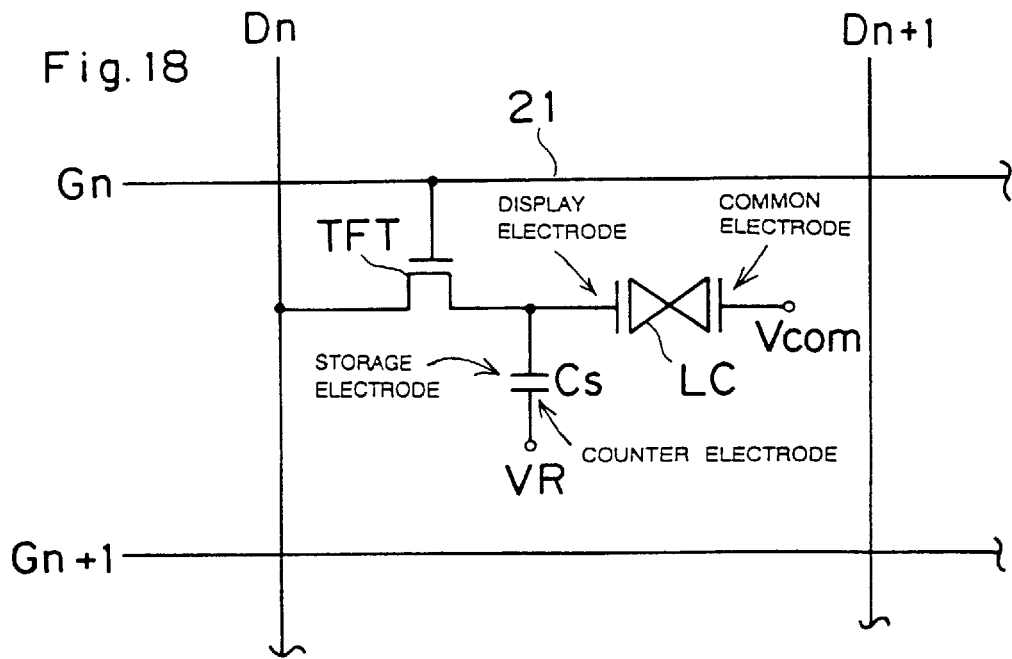
FIG. 18 is an equivalent circuit diagram of a pixel part.
Figure 19:
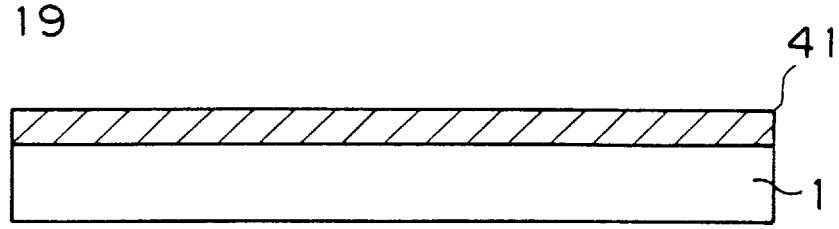
FIG. 19 is a sectional view for illustrating a fabrication step in a second embodiment according to the first aspect of the present invention.
Figure 20:
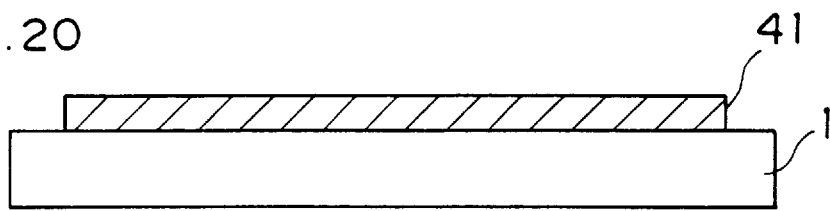
FIG. 20 is a sectional view for illustrating a fabrication step in the second embodiment according to the first aspect of the present invention.
Figure 21:
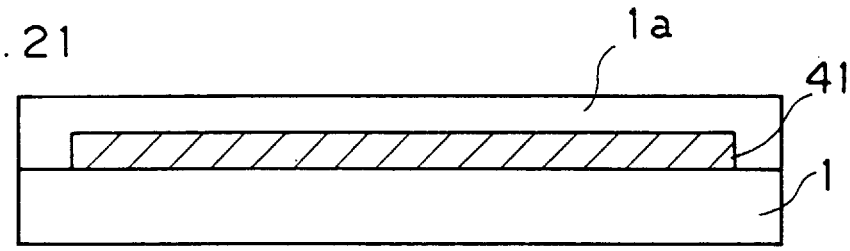
FIG. 21 is a sectional view for illustrating a fabrication step in the second embodiment according to the first aspect of the present invention.
Figure 22:
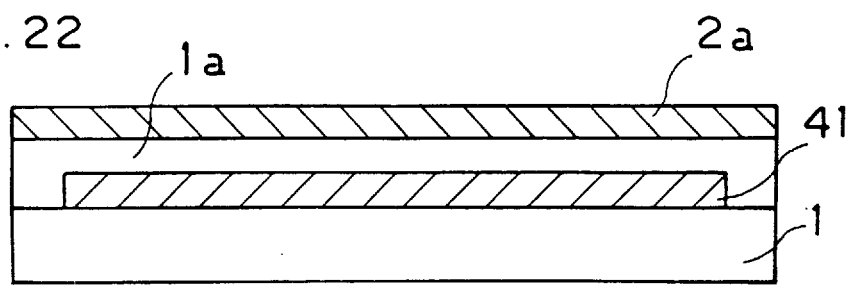
FIG. 22 is a sectional view for illustrating a fabrication step in the second embodiment according to the first aspect of the present invention.
Figure 23:
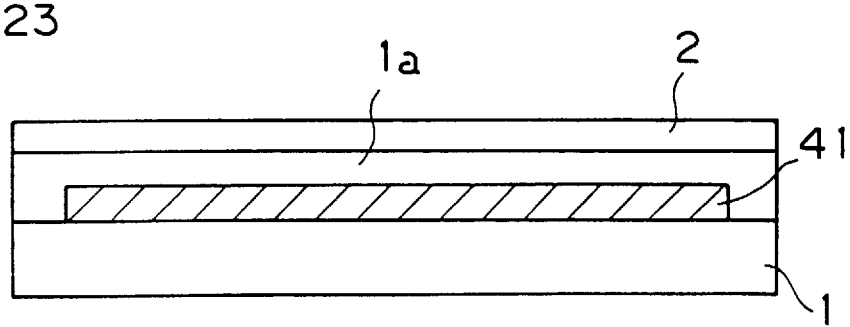
FIG. 23 is a sectional view for illustrating a fabrication step in the second embodiment according to the first aspect of the present invention.
Figure 24:
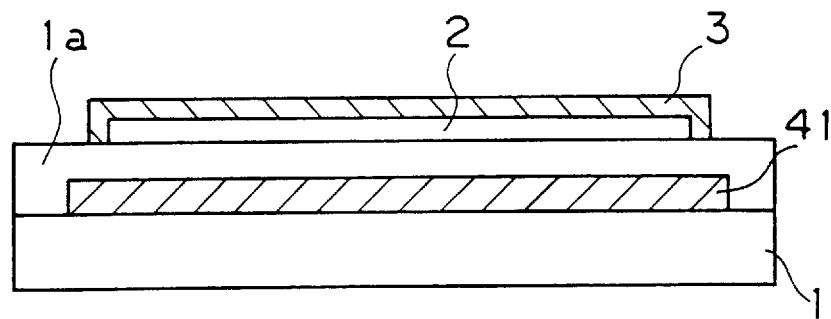
FIG. 24 is a sectional view for illustrating a fabrication step in the second embodiment according to the first aspect of the present invention.
Figure 25:
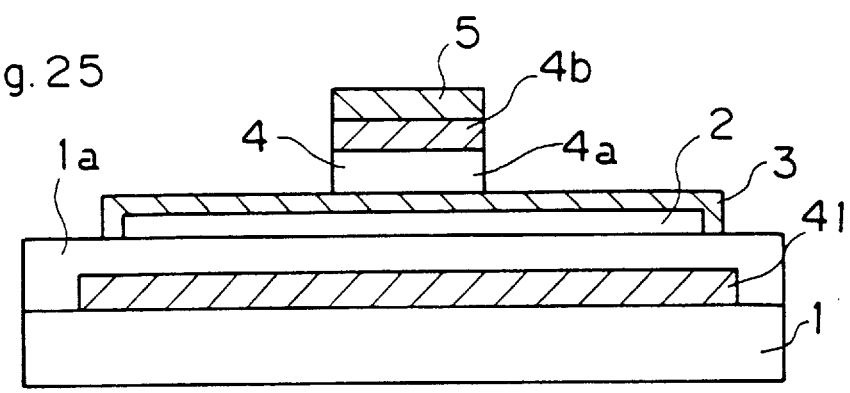
FIG. 25 is a sectional view for illustrating a fabrication step in the second embodiment according to the first aspect of the present invention.
Figure 26:
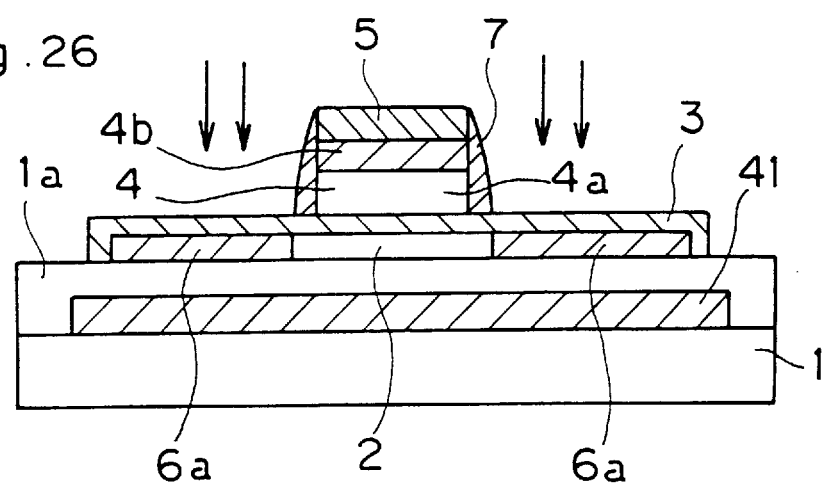
FIG. 26 is a sectional view for illustrating a fabrication step in the second embodiment according to the first aspect of the present invention.
Figure 27:
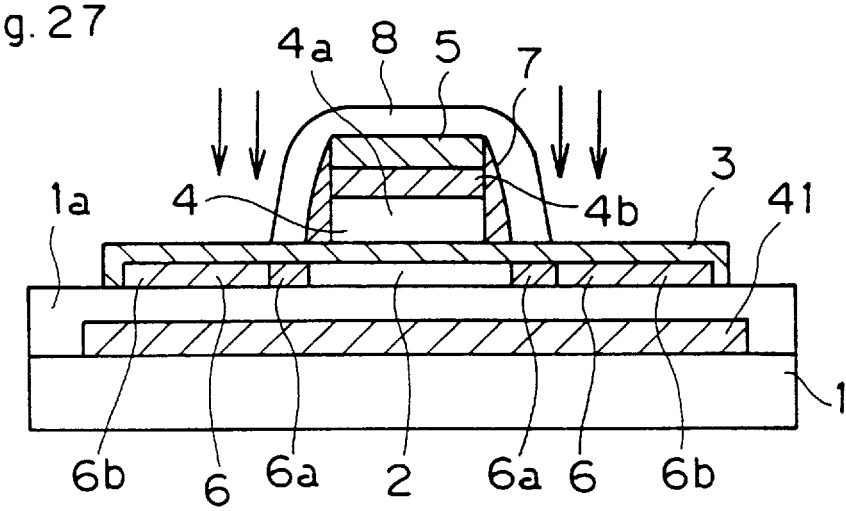
FIG. 27 is a sectional view for illustrating a fabrication step in the second embodiment according to the first aspect of the present invention.
Figure 28:
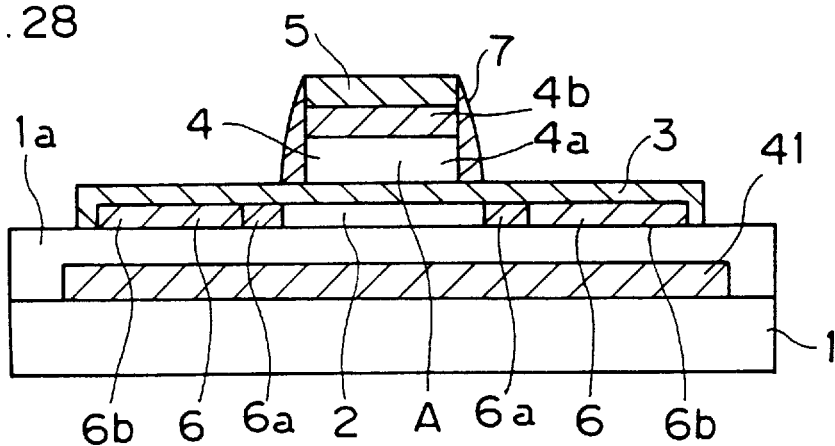
FIG. 28 is a sectional view for illustrating a fabrication step in the second embodiment according to the first aspect of the present invention.

FIG. 18 illustrates an equivalent circuit of the pixel 21 provided on the intersection between the gate wire Gn and the drain wire Dn.

The pixel 21 is formed by a TFT, which is similar to the thin film transistor A, for serving as a pixel driving element, a liquid crystal cell LC, and a storage capacitance Cs. The gate and the drain of the TFT are connected to the gate wire Gn and the drain wire Dn respectively. Further, a display electrode (pixel electrode) of the liquid cell LC and the storage capacitance (additional capacitance) Cs are connected to the source of the TFT.

A signal storage element is formed by the liquid crystal cell LC and the storage capacitance Cs. A voltage Vcom is applied to a common electrode, which is opposite to the display electrode, of the liquid crystal cell LC. On the other hand, a constant voltage VR is applied to an electrode of the storage capacitance Cs which is opposite to the side connected with the source of the TFT. The common electrode of the liquid crystal cell LC is literally common to all pixels 21. An electrostatic capacitance is formed between the display electrode and the common electrode of the liquid crystal cell LC. In the storage capacitance Cs, the electrode opposite to the side connected with the source of the TFT may be connected with the adjacent gate wire Gn+1.

When the gate wire Gn is set at a positive voltage and the positive voltage is applied to the gate of the TFT in the pixel 21 having the aforementioned structure, the TFT is turned on. Then, the electrostatic capacitance of the liquid crystal cell LC and the storage capacitance Cs are charged with the data signal which is applied to the drain wire Dn. When the gate wire Gn is set at a negative voltage and the negative voltage is applied to the gate of the TFT, on the other hand, the TFT is turned off so that the voltage currently applied to the drain wire Dn is held by the electrostatic capacitance of the liquid crystal cell LC and the storage capacitance Cs. Thus, it is possible to make the pixel 21 hold an arbitrary data signal by supplying a data signal to be written in the pixel 21 to the drain wire and controlling the voltage of the gate wire. The transmittance of the liquid crystal cell LC is varied with the data signal held by the pixel 21, thereby displaying a picture.

Important characteristics of the pixel 21 are writability and holdability. Required for the writability is the point whether or not a desired video signal voltage can be sufficiently written in the signal storage element (the liquid crystal cell LC and the storage capacitance Cs) in a unit time which is set in relation to the specification of the pixel part 20. On the other hand, required for the holdability is the point whether or not the video signal voltage once written in the signal storage element can be held by a necessary time.

The storage capacitance Cs is adapted to increase the electrostatic capacitance of the signal storage element thereby improving the writability and the holdability. The liquid crystal cell LC is limited in increase of the electrostatic capacitance, due to its structure. Thus, the storage capacitance Cs is adapted to compensate for the insufficient electrostatic capacitance of the liquid crystal cell LC.

A second embodiment according to the first aspect of the present invention is now described with reference to FIGS. 19 to 28. Portions equivalent to those described with reference to the first embodiment are denoted by the same reference numerals, to omit redundant description. In the second embodiment, steps corresponding to the steps 1 to 8 of the first embodiment are different, and hence only these steps are described.

Step (1) (see FIG. 19): A W silicide film 41 is formed on a substrate 1.

Step (2) (see FIG. 20): The W silicide film 41 is worked into the same pattern as a polycrystalline silicon film serving as an active layer of a transistor.

Step (3) (see FIG. 21): An insulating thin film 1a of $SiO_2$ or SiN is formed by CVD or sputtering, to cover the substrate 1 and the W silicide film 41.

Step (4) (see FIG. 22): An amorphous silicon film 2a is formed on the insulating thin film 1a.

Step (5) (see FIG. 23): The surface of the amorphous silicon film 2a is scanned with a KrF excimer laser beam to be annealed, melted and recrystallized for forming a polycrystalline silicon thin film 2.

The KrF excimer laser beam may be replaced with an XeCl excimer laser beam or an ArF excimer laser beam.

Step (6) (see FIG. 24): The polycrystalline silicon film 2 is worked into a prescribed shape by photolithography and dry etching by RIE, to be employed as an active layer of a thin film transistor.

Then, an LTO film 3 for serving as a gate insulating film is formed on the polycrystalline silicon film 2.

Step (7) (see FIG. 25): An amorphous silicon film 4a is deposited on the gate insulating film 3.

Then, a W silicide film 4b is formed on the amorphous silicon film 4a.

A silicon oxide film 5 is deposited on the W silicide film 4b, and thereafter the polycrystalline silicon film 4a, the W silicide film 4b and the silicon oxide film 5 are worked into prescribed shapes by photolithography and dry etching by RIE. The amorphous silicon film 4a is employed as a gate electrode 4 of a polycide structure, along with the W silicide film 4b.

Step (8) (see FIG. 26): A silicon oxide film is deposited on the gate insulating film 3 and the silicon oxide film 5 by normal pressure CVD, and anisotropically etched back overall, thereby forming side walls 7 on side portions of the gate electrode 4 and the silicon oxide film 5.

Then, phosphorus (P) ions are implanted as an impurity by self alignment through the side walls 7 serving as masks, under conditions of an acceleration voltage of 80 KeV and a dosage of $3 \times 10^{13}$ $cm^{-2}$, for forming low concentration impurity regions 6a.

Step (9) (see FIG. 27): The side walls 7 and the silicon oxide film 5 are covered with a resist film 8, and phosphorus (P) ions are implanted as an impurity by self alignment again through the resist film 8 serving as a mask under conditions of an acceleration voltage of 80 KeV and a dosage of $1 \times 10^{15}$ $cm^{-2}$ for forming high concentration impurity regions 6b, thereby forming source/drain regions 6 of an LDD (lightly doped drain) structure.

Step (10) (see FIG. 28): In this state, rapid heating is performed by RTA, similarly to the first embodiment.

Light heat from an Xe arc lamp is more strongly absorbed in an amorphous part and a silicide part as compared with a polycrystalline part, and hence only necessary portions can be selectively heated. Thus, this step is suitable for reducing the resistance of a (gate) wire and activating the impurity.

Particularly in this embodiment, the W silicide film 41 is formed in correspondence under the polycrystalline silicon film 2. This W silicide film 41 has a function of absorbing the heat in RTA, and the impurity contained in the polycrystalline silicon film 2 is activated also by radiation heat from the W silicide film 41 absorbing heat. Namely, the polycrystalline silicon film 2 is directly and indirectly heated by the heat from the Xe arc lamp and the radiation heat from the W silicide film 41, so that the overall polycrystalline silicon film 2 is homogeneously heated and the activation is excellently performed with no dispersion.

The size of the W silicide film 41 may be basically identical to or larger than that of the polycrystalline silicon film 2, while the W silicide film 41 is more preferably adjusted to have an area corresponding to the size of an in-plane pattern.

In an integrated semiconductor device, pattern irregularity is caused on its substrate. If W silicide films 2 are equally provided on respective transistors, therefore, thermal absorptivity per unit area is varied with the position and the heat treatment cannot be homogeneously performed, while the temperature may be extremely increased in a portion where the W silicide films 41 are concentrated, to deform the substrate 1.

When the density per unit area of heat absorption films arranged as lower layers is rendered substantially constant regardless of patterns formed on upper layers, therefore, it is possible to eliminate displacement in temperature distribution in activation by RTA. In the concrete, the pixel part of a driver-integrated LCD panel has a higher transistor density than the driver part, and hence the temperature distribution of the overall substrate 1 can be substantially homogenized by increasing the size of each W silicide film 41 corresponding to each transistor of the driver part as compared with that in the pixel part.

The LCD panel is preferably so adjusted that about 10% of the circuit area is occupied by W silicide films 41.

Through this step, a polycrystalline silicon TFT (thin film transistor) A is formed.

According to this embodiment, the polycrystalline silicon TFT can be fabricated in the so-called low temperature process, with employment of a high-quality polycrystalline silicon film as an active layer.

According to an experiment made by the inventor, it has been proved possible to implement transistors of high performance with mobility $\mu n$ of at least 200 $cm^2/V.s$ in an n-channel MOS polycrystalline silicon TFT and mobility $\mu p$ of at least 150 $cm^2/V.s$ in a p-channel MOS polycrystalline silicon TFT.

Such a high performance TFT is sufficiently applicable to an LCD panel for displaying NTSC television signals requiring mobility $\mu n$ of 50 $cm^2/V.s$ or $\mu p$ of 20 $cm^2/V.s$, for example, and can attain characteristics of mobility $\mu n$ of 50 $cm^2/V.s$ or $\mu p$ of 20 $cm^2/V.s$, a threshold voltage of 2 V (n channel) or −5 V (p channel), an S value (sub-threshold swing value) of 0.2 V/decade, and an ON-OFF ratio of $1 \times 10^7$.

The drivability of the TFT is improved due to the high mobility, whereby the size of the TFT can be reduced to not more than ⅛ (W/L=8/5 $\mu m$) as compared with a conventional transistor (W/L=34/10 $\mu m$) employing an active layer of amorphous silicon. Due to the high-quality active layer, further, a leakage current is small in an OFF state of the transistor, and the area of the storage capacitance can be reduced to not more than ⅓.

In the concrete, a high numerical aperture of 55% (1.5 times as compared with the prior art) can be attained in a size 2.4 type panel with high concentration pixels of at least three times the conventional panel at pixel pitches of 50.0 (H) $\mu m$ by 150 (V) $\mu m$ and a pixel number of 2,300,000 dots (320×3 (RGB)×240), thereby implementing improvement in luminance.

The aforementioned embodiment can be modified as follows, to attain functions and effects similar to the above:

1) The substrate 1 can also be formed by an ordinary glass plate or the like, depending on conditions.

2) In the step 2 or (4), the amorphous silicon film 2a is deposited by low pressure CVD with monosilane gas, for example, at a temperature of 580° C. Thus, the amorphous silicon film 2a contains microcrystals.

When the amorphous silicon film 2a containing microcrystals is polycrystallized by solid-phase crystallization, the crystal growth can be completed in a short time although the mobility is slightly reduced due to the reduction of the crystal grain sizes.

3) In the step 2 or (4), the amorphous silicon film 2a is formed not by low pressure CVD or plasma CVD but by any one of a group consisting of normal pressure CVD, photo-excitation CVD, vapor deposition, EB (electron beam) deposition, MBE (molecular beam epitaxy), and sputtering.

4) A portion of the polycrystalline silicon film 2 corresponding to a channel region is doped with an impurity, for controlling the threshold voltage (Vth) of the polycrystalline silicon TFT. In a polycrystalline silicon TFT formed by solid-phase crystallization, the threshold voltage tends to shift in a depression direction in case of an N-channel transistor, or in an enhancement direction in case of a P-channel transistor. This tendency further remarkably appears when hydrogenation is performed. In order to suppress such shifting of the threshold voltage, the channel region may be doped with an impurity.

5) The step 3 or (5) is replaced with the following step:

Step 3a: A heat treatment is performed in an electric furnace in a nitrogen ($N_2$) atmosphere at a temperature of about 600° C. for about 20 hours, thereby forming the polycrystalline silicon film 2 by solid-phase crystallization of the amorphous silicon film 2a.

6) In the polycrystalline silicon film 2 formed in the step 3a, a number of defects such as dislocations are present in crystals forming the film while amorphous parts may remain between the crystals, to result in a high leakage current.

After the step 3a, therefore, the substrate 1 is rapidly heated by RTA or laser annealing, for improving the film quality of the polycrystalline silicon film 2.

7) The electric furnace can treat a number of substrates at once although the same requires a longer time as compared with laser irradiation, and hence each of the steps 5) and 6) substantially has high throughput. Therefore, the subsequent heat treatment for activating the impurity regions, for example, may be performed by laser beam annealing, in place of RTA. The RTA has such an advantage that the treatment can be completed in a short time, while the laser annealing has such an advantage that sheet resistance can be reduced since the temperatures of the impurity regions can be increased to high levels.

8) In the step 5, (1) or (7), the W silicide film 4b or 41 is formed by PVD such as vacuum deposition, ion plating, ion beam deposition, a cluster ion beam method or the like, in place of sputtering. Also in this case, the composition of W silicide ($WSi_x$) is set at X>2 for a reason similar to that for the aforementioned sputtering.

9) In the step 5, (1) or (7), the W silicide film 4b or 41 is formed by CVD. The source gas therefor may be prepared from tungsten hexafluoride ($WF_6$) and silane ($SiH_4$). The film forming temperature is set at about 350° to 450° C. Also in this case, the composition of W silicide ($WSi_x$) is set at X>2 for a reason similar to that for the aforementioned sputtering. The CVD is superior in step coverage to the PVD, whereby the thickness of the W silicide film 4b can be further homogenized.

10) In place of W silicide employed for the gate electrode, high melting point metal silicide such as $MoSi_2$, $TiSi_2$, $TaSi_2$ or $CoSi_2$, or a high melting point metal such as W, Mo, Co, Cr, Ti or Ta may be employed.

11) In the step 9, the plasma oxide film may be replaced with a plasma TEOS oxide film employing TEOS (tetraethyl orthosilicate or tetraethoxysilane), or the silicon oxide film may be replaced with a normal pressure ozone TEOS oxide film.

Deposition conditions for the plasma TEOS oxide film are a deposition temperature of 390° C., an RF output of 500 W, a TEOS flow rate of 500 sccm, an oxygen flow rate of 600 sccm and a pressure of 9 Torr, and those for the normal pressure ozone TEOS oxide film are a deposition temperature of 400° C., an RF output of 300 W, ozone concentration of about 5 wt. %, and a TEOS carrier $N_2$ gas flow rate of 3000 cc.

12) When the plasma TEOS oxide film is exposed to nitrogen ions by a plasma treatment with ammonia ($NH_3$) gas after the step 11) so that its surface is nitrided and thereafter a normal pressure ozone TEOS oxide film is deposited, the growth rate of the silicon oxide film is further stabilized. The nitriding conditions are a temperature of 360° C., an RF output of 500 W, an ammonia flow rate of 100 to 500 sccm, and an $N_2$ flow rate of 0 to 400 sccm. In this nitriding, ammonia may be replaced with nitrogen.

13) In place of the W silicide film 41, a semiconductor film such as an amorphous silicon film or a polycrystalline silicon film is employed. Such a silicon film may be doped with an impurity. When a conductive or semiconductor film is employed and a voltage is applied to this heat absorption film, the TFT can be driven as a four-terminal device similarly to a MOS transistor which is applied to an LSI for controlling the threshold voltage. When a glass substrate is employed, on the other hand, the transistor can be electro- statically shielded against ions contained in the substrate, and prevented from deterioration of the characteristics caused by the ions in the glass substrate and from a bad influence exerted by potentials formed by movable ions.

14) In place of the W silicide film 41, a film of high melting point metal silicide such as $MoSi_2$, $TiSi_2$, $TaSi_2$ or $CoSi_2$, or a high melting point metal such as W, Mo, Co, Cr, Ti or Ta may be employed. When the employed temperature is low (not more than about 450° C.), the so-called low melting point metal such as Al or Au may be employed.

Such a metal film (including the W silicide film) has a property of transmitting no light, whereby the following effects are attained:

a) The film prevents scattering of light and shields the liquid crystal cell against unnecessary light obliquely entering the same, whereby the contrast of the LCD device is improved.

b) The film shields the TFT against light entering the same, whereby a leakage current caused by the light is reduced for improving the characteristics of the TFT, while deterioration of the TFT itself caused by the light is prevented.

15) The present invention is applied to not only to a planar type TFT but polycrystalline silicon TFTs of all structures such as reverse-planar, stagger and reverse-stagger type TFTs.

16) The present invention is applied not only to a polycrystalline silicon TFT but to general insulated gate semiconductor devices. Further, the present invention is applied to all semiconductor devices employing polycrystalline silicon films such as photoelectric conversion elements such as a solar cell and an optical sensor, a bipolar transistor, a static induction transistor (SIT) and the like.

An embodiment according to the second to fifth aspects of the present invention is now described with reference to FIGS. 33 to 42.

Step 1 (see FIG. 33): A tungsten silicide ($WSi_x$) film 62 of 1000 Å in thickness, which is adjustable in the range of 50 to 2000 Å, is formed on a substrate 61 of quartz glass or no-alkali glass by sputtering. In the sputtering, an alloy target of W silicide is employed. While the stoichiometric composition of W silicide ($WSi_x$) is X=2, the composition of the alloy target is set at X>2. If the composition of the W silicide film 62 is close to X=2, extremely high tensile stress takes place in a later treatment step and the W silicide film 62 may be cracked or separated. However, the resistance value of the W silicide is minimized in case of X=2, and hence the upper limit of X must be set to cause neither cracking nor separation.

Step 2 (see FIG. 34): The W silicide film 62 is worked into the same pattern as a polycrystalline silicon film for serving as an active layer of a transistor as described later, by lithography and etching.

Step 3 (see FIG. 35): An insulating thin film 63 of $SiO_2$ or SiN is formed by CVD or sputtering, to cover the substrate 61 and the W silicide film 62. In the concrete, the substrate 61 is prepared from no-alkali glass, so that an $SiO_2$ film of 3000 to 5000 Å in thickness is formed on its surface by normal or low pressure CVD at a formation temperature of 350° C.

This $SiO_2$ film must have such a thickness that no impurity passes through the $SiO_2$ film to diffuse into an upper layer from the substrate 61 in a later step of a heat treatment or irradiation with a beam. This thickness is properly selected in the range of 1000 to 6000 Å, and an excellent diffusion preventing effect can be attained when the thickness is in the range of 2000 to 6000 Å, most properly in the range of 2000 to 5000 Å.

When the insulating thin film 63 is prepared from SiN, on the other hand, the thickness of this film is properly selected in the range of 1000 to 5000 Å, and an excellent diffusion preventing effect can be attained when the thickness is in the range of 2000 to 5000 Å, most properly in the range of 2000 to 3000 Å.

Step 4 (see FIG. 36): An amorphous silicon film 64a of 500 Å in thickness is formed on the insulating thin film 63. When the amorphous silicon film 64a is employed as an active layer of a polycrystalline TFT, the OFF-state current of the TFT is increased if the thickness of the active layer is too large while the ON-state current is reduced if the thickness is too small. Therefore, the thickness of the amorphous silicon film 64a is properly selected in the range of 400 to 800 Å, and excellent characteristics are attained when the thickness is in the range of 500 to 700 Å, most properly in the range of 500 to 600 Å.

The amorphous silicon film 64a is formed in the following manner:

(1) With employment of low pressure CVD: In order to form the amorphous silicon film 64a by low pressure CVD, thermal decomposition of monosilane ($SiH_4$) or disilane ($Si_2H_6$) is employed. When monosilane is employed, the film becomes amorphous when the treatment temperature is not more than 550° C., or becomes polycrystalline when the treatment temperature is in excess of 620° C. In the treatment temperature range of 550° to 620° C., the ratio of amorphous materials including microcrystals is increased, and the film approaches an amorphous state and the ratio of the microcrystals is reduced as the temperature is reduced. Thus, the amount of microcrystals contained in the amorphous silicon film 64a can be adjusted by simply changing the temperature condition.

(2) With employment of plasma CVD: In order to form the amorphous silicon film 64a by plasma CVD, thermal decomposition of monosilane or disilane in a plasma is employed.

In practice, plasma CVD is employed for forming an amorphous silicon film containing no microcrystals with monosilane gas under a temperature of 350° C.

Step 5 (see FIG. 37): The surface of the amorphous silicon film 64a is irradiated and scanned with a KrF excimer laser beam having a wavelength λ of 248 nm to be annealed, melted and recrystallized for forming a polycrystalline silicon thin film 64.

The laser conditions for this step are an annealing atmosphere of not more than $1 \times 10^{-4}$ Pa, a substrate temperature in the range of the room temperature to 600° C., irradiation energy density of 100 to 500 $mJ/cm^2$, and a scanning rate of 1 to 10 mm/sec. (in practice, the film can be scanned at a rate in the range of 0.1 to 100 mm/sec.).

The KrF laser beam may be replaced with an XeCl excimer laser beam having a wavelength λ of 308 nm. In this case, the laser conditions are an annealing atmosphere of not more than $1 \times 10^{-4}$ Pa, a substrate temperature in the range of the room temperature to 600° C., irradiation energy density of 100 to 500 $mJ/cm^2$, and a scanning rate of 1 to 10 mm/sec. (in practice, the film can be scanned at a rate in the range of 0.1 to 100 mm/sec.).

Alternatively, an ArF excimer laser beam having a wavelength λ of 193 nm may be employed. In this case, the laser conditions are an annealing atmosphere of not more than $1 \times 10^{-4}$ Pa, a substrate temperature in the range of the room temperature to 600° C., irradiation energy density of 100 to 500 $mJ/cm^2$, and a scanning rate of 1 to 10 mm/sec.

In any case, the grain size of polycrystalline silicon is increased in proportion to the irradiation energy density and the number of irradiation times, and hence the energy density may be adjusted to attain a desired grain size.

According to this embodiment, the high throughput laser irradiation shown in FIG. 29 is employed for this excimer laser annealing.

Step 6 (see FIG. 38): The polycrystalline silicon film 64 is worked into a prescribed shape by photolithography and dry etching by RIE, to be employed as an active layer of a thin film transistor.

Then, an LTO film (low temperature oxide film: silicon oxide film) 65 of 1000 Å in thickness for serving as a gate insulating film is formed on the polycrystalline silicon film 64 by low pressure CVD through a load locking low pressure CVD apparatus.

Step 7 (see FIG. 39): An amorphous silicon film 66a of 2000 Å in thickness is deposited on the gate insulating film 65 by low pressure CVD. This amorphous silicon film 66a is doped with an impurity (arsenic or phosphorus serving as an N-type impurity, or boron serving as a P-type impurity) in formation thereof. Alternatively, the film 66a may be deposited in a non-doped state, so that the impurity is thereafter implanted into the same.

Then, a tungsten silicide ($WSi_x$) film 66b of 1000 Å in thickness is formed on the amorphous silicon film 66a by sputtering.

Then, a silicon oxide film 67 is deposited on the W silicide film 66b by normal pressure CVD, and thereafter the polycrystalline silicon film 66a, the W silicide film 66b and the silicon oxide film 67 are worked into prescribed shapes by photolithography and dry etching by RIE. The amorphous silicon film 66a is employed as a gate electrode 66 of a polycide structure, along with the W silicide film 66b.

Step 8 (see FIG. 40): A silicon oxide film is deposited on the gate insulating film 65 and the silicon oxide film 67 by normal pressure CVD and anisotropically etched back overall, thereby forming side walls 68 on side portions of the gate electrode 66 and the silicon oxide film 67.

Then, phosphorus (P) ions are implanted into the polycrystalline silicon film 64 as an impurity by self alignment through the side walls 68 serving as masks, under conditions of an acceleration voltage of 80 KeV and a dosage of $3 \times 10^{13}$ $cm^{-2}$, for forming low concentration impurity regions 69a.

Step 9 (see FIG. 41): The side walls 68 and the silicon oxide film 67 are covered with a resist film 70, and phosphorus (P) ions are implanted into the polycrystalline silicon film 64 as an impurity again by self alignment through the resist film 70 serving as a mask under conditions of an acceleration voltage of 80 KeV and a dosage of $1 \times 10^{15}$ $cm^{-2}$ for forming high concentration impurity regions 69b, thereby forming source/drain regions 69 of an LDD (lightly doped drain) structure.

Step 10 (see FIG. 42): In this state, rapid heating is performed by the RTA (rapid thermal annealing) shown in FIG. 30.

The RTA conditions for this operation are a heat source of an Xe arc lamp, a temperature of 700° to 950° C. (pyrometer), an $N_2$ atmosphere, and a time of 1 to 3 seconds. Although the heating by RTA is performed at a high temperature, this step can be completed in an extremely short time and hence the substrate 61 is not deformed.

In order to avoid abrupt application of a high temperature to the substrate 61, RTA may be performed a plurality of times. In this case, RTA is performed for 1 to 3 seconds every time, and the temperature is increased stepwise from 400° C. for the initial time to 700° to 950° C. for the final time.

In more concrete terms, the heating may be performed six times, for example, in a nitrogen (N$_2$) atmosphere, so that the treatment temperature is increased stepwise every time. For example, the temperature is gradually increased as 400° C. (pyrometer, identical for the rest) for the initial time (first time)→500° C. for the second time→550° C. for the third time→600° C. for the fourth time→650° C. for the fifth time→700° C. for the final time (sixth time). Thus, the substrate 61 can be prevented against warp or breakage. The treatment time is 1 to 3 seconds every time, for example.

The temperature can be adjusted by not turning on the Xe arc lamp 106 but employing the heat of the preheater 109 at the initial time and changing the power of the Xe arc lamp 106 in the range of 1 to 7 KW from the second time.

Light heat from the Xe arc lamp is more strongly absorbed in an amorphous part and a silicide part as compared with a polycrystalline part, and hence only necessary portions can be selectively heated. Thus, this step is suitable for reducing the resistance of a (gate) wire and activating the impurity. Further, heating through the W silicide film 62 can also be effectively performed, as described later.

Due to the rapid heating, the impurity in the source/drain regions 69 is activated and the amorphous silicon film 66a is polycrystallized, while the sheet resistance of the gate electrode 66 in a polycide structure by the polycrystalline silicon film 66a and the W silicide film 66b is reduced to about 20 to 22 Ω/□.

Further, the sheet resistance of the activated source/drain regions 66 is also reduced to 1 to 1.5 kΩ/□ in case of an N type or 1 to 1.2 kΩ/□ in case of a P type, equivalently to a high temperature heat treatment by a diffusion furnace employed in a high temperature process.

Particularly in this embodiment, the W silicide film 62 is formed in correspondence under the polycrystalline silicon film 64. This W silicide film 62 has a function of absorbing the heat in RTA, and the impurity contained in the polycrystalline silicon film 64 is activated also by radiation heat from the W silicide film 62 absorbing heat. Namely, the polycrystalline silicon film 64 is directly and indirectly heated by the heat from the Xe arc lamp and the radiation heat from the W silicide film 62, so that the overall polycrystalline silicon film 64 is homogeneously heated and the activation is excellently performed with no dispersion.

The size and region of the W silicide film 62 may be substantially identical to or smaller than that of the polycrystalline silicon film 64. The term "substantially" means the range including ±20%.

In an integrated semiconductor device, pattern irregularity is caused on its substrate. If W silicide films 62 are equally provided on respective transistors, therefore, thermal absorptivity per unit area is varied with the position and the heat treatment cannot be homogeneously performed, while the temperature may be extremely increased in a portion where the W silicide films 62 are concentrated, to deform the substrate 61.

When the density per unit area of heat absorption films arranged as lower layers is rendered substantially constant regardless of patterns formed on upper layers, therefore, it is possible to eliminate displacement in temperature distribution in activation by RTA. In the concrete, the pixel part of a driver-integrated LCD panel has a higher transistor density than the driver part, and hence the temperature distribution of the overall substrate 61 can be substantially homogenized by increasing the size of each W silicide film 62 corresponding to each transistor of the driver part as compared with that in the pixel part.

The LCD panel is preferably so adjusted that about 10 % of the circuit area is occupied by W silicide films 62.

Through this step, a polycrystalline silicon TFT (thin film transistor) A is formed.

Figure 43:
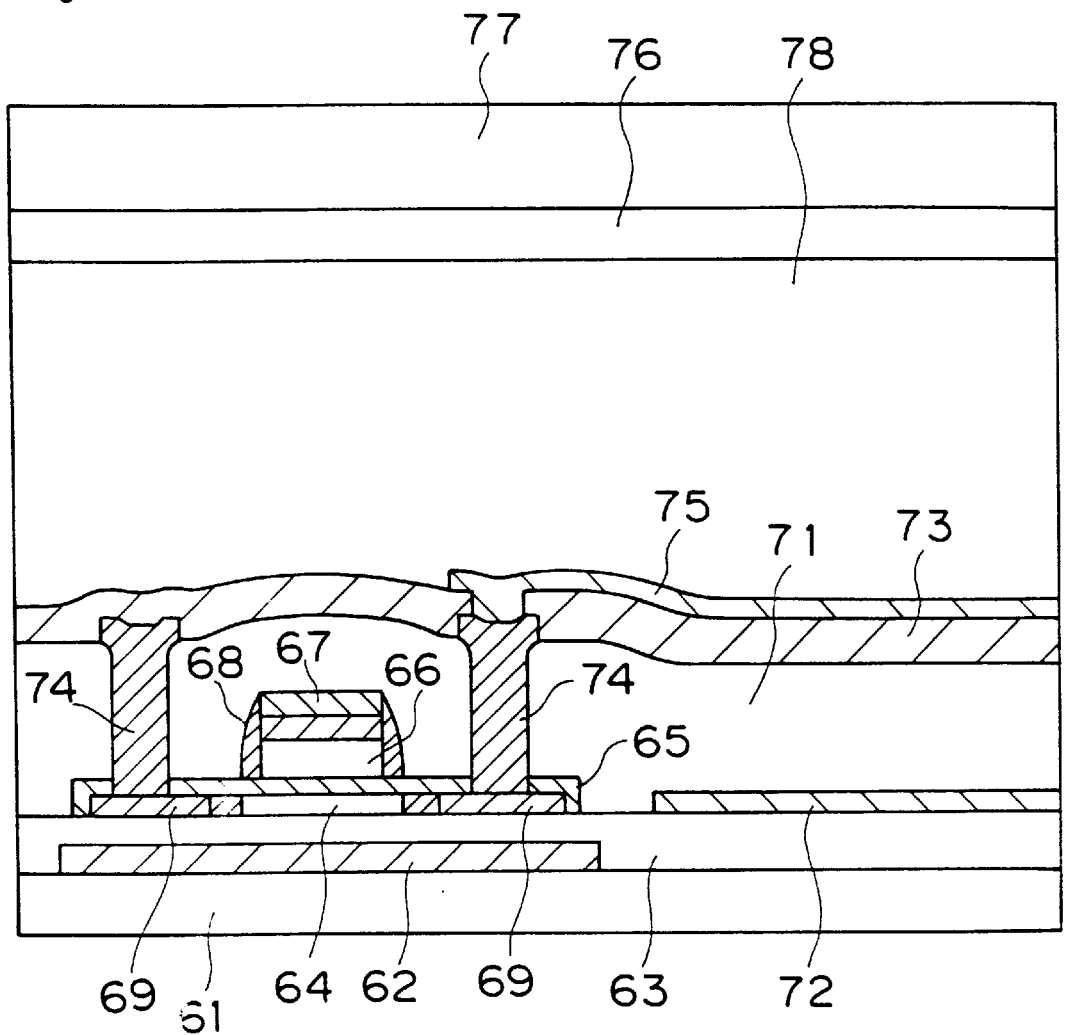
FIG. 43 is a sectional view showing the structure of a pixel part of an LCD according to an embodiment of the present invention.

The structure of a pixel part of an LCD having a transmission structure employing the polycrystalline silicon TFT (A) fabricated in the aforementioned manner as each pixel driving element with reference to FIG. 43.

Step [1]: In advance of formation of an interlayer insulating film 71, a storage electrode 72 of a storage capacitance consisting of ITO (indium tin oxide) is formed on a pixel part region of the substrate 61 by sputtering.

Step [2]: An insulating film 73 is formed on the overall surface of the device. The insulating film 73 is made of silicon oxide, silicate glass or silicon nitride, and formed by CVD or PVD.

Then, contact holes are formed in the insulating film 73 to be in contact with source/drain electrodes 74, an ITO film is formed on the overall surface of the device including the contact holes, and this ITO film is patterned for forming a display electrode 75.

Step [3]: The transparent insulating substrate 61 provided with the polycrystalline silicon TFT (A) is opposed to a transparent insulating substrate 77 provided with a common electrode 76 on its surface, and liquid crystals are sealed between the substrates 61 and 71 for forming a liquid crystal layer 78. Consequently, a pixel part of the LCD is completed.

The pixel part formed in the aforementioned manner can be employed as that of the active matrix LCD shown in FIGS. 17 and 18.

In the aforementioned embodiment, the size and region of the W silicide film 62 may be substantially identical to or smaller than that of the polycrystalline silicon film 64.

Figure 44:
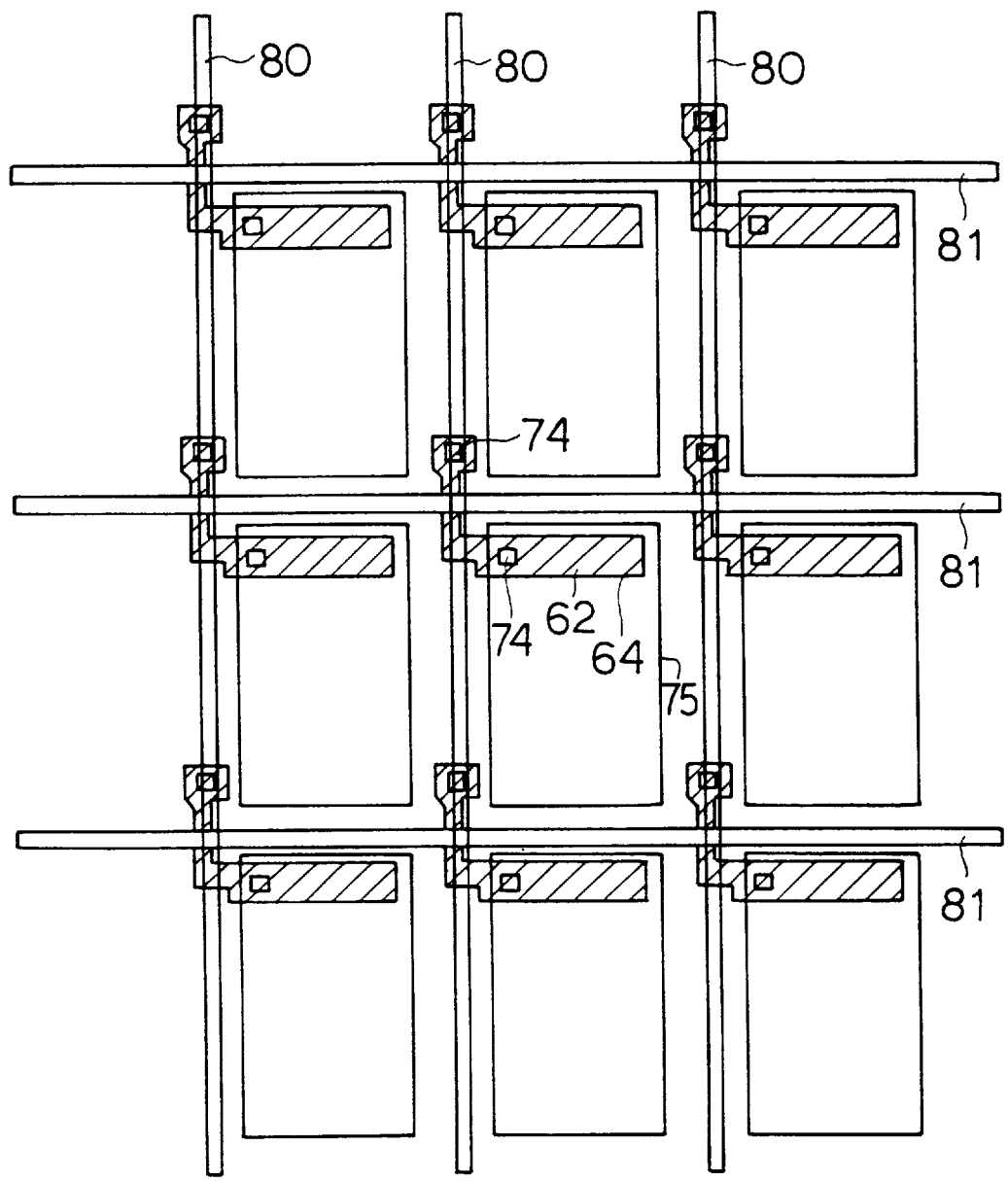
FIG. 44 is a plan view showing an exemplary region for forming a heat absorption film according to the present invention.

FIG. 44 is a plan view showing the region for providing the W silicide film 62 which is the heat absorption film. Referring to FIG. 44, the W silicide film 62 is provided in the substantially same region (shown by hatching) as the polycrystalline silicon film 64. In the peripheral driving circuit part, in which the semiconductor films are relatively concentrated compared to the pixel part, the heat absorption film is preferably provided in a smaller size within the region corresponding to the semiconductor film.

Figure 45:
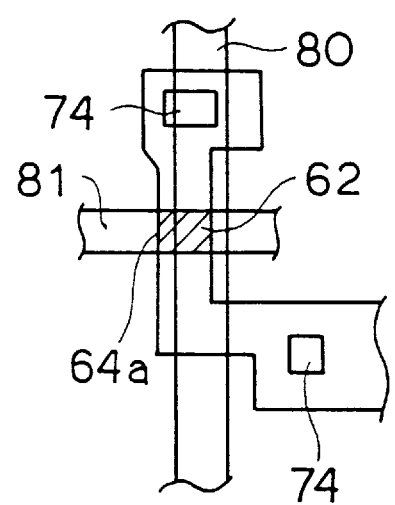
FIG. 45 is a plan view showing another exemplary region for forming a heat absorption film according to the present invention.

FIG. 45 is a plan view showing another exemplary region of the heat absorption film according to the present invention. Referring to FIG. 45, the heat absorption film 62 is provided only in a channel region 64a (shown by hatching) of the polysilicon film.

In an integrated semiconductor device, pattern irregularity is caused on its substrate as described above. If W silicide films 62 are equally provided on respective transistors, therefore, thermal absorption per unit area is varied with the position and the heat treatment cannot be homogeneously performed, while the temperature may be extremely increased in a portion where the W silicide films 62 are concentrated, to deform the substrate 61.

When the density per unit area of the W silicide films 62 arranged as lower layers is rendered substantially constant regardless of patterns formed on upper layers, therefore, it is possible to eliminate displacement in temperature distribution in activation by RTA.

In a driver-integrated LCD panel such as that of this embodiment, the concentration of the TFTs (A) in the pixel part 20 is higher than that in the peripheral driving circuit part 24, and hence the temperature distribution of the overall substrate 61 is substantially homogenized when the area of each W silicide film 62 corresponding to each TFT (A) of the peripheral driving circuit part 24 is increased beyond that in the pixel part 20. In the LCD panel, the peripheral driving circuit part 24 requires no transmittance, and hence the sizes of the W silicide films 62 can be adjusted in the range of zero to the overall region of the peripheral driving circuit part 24.

Figure 46:
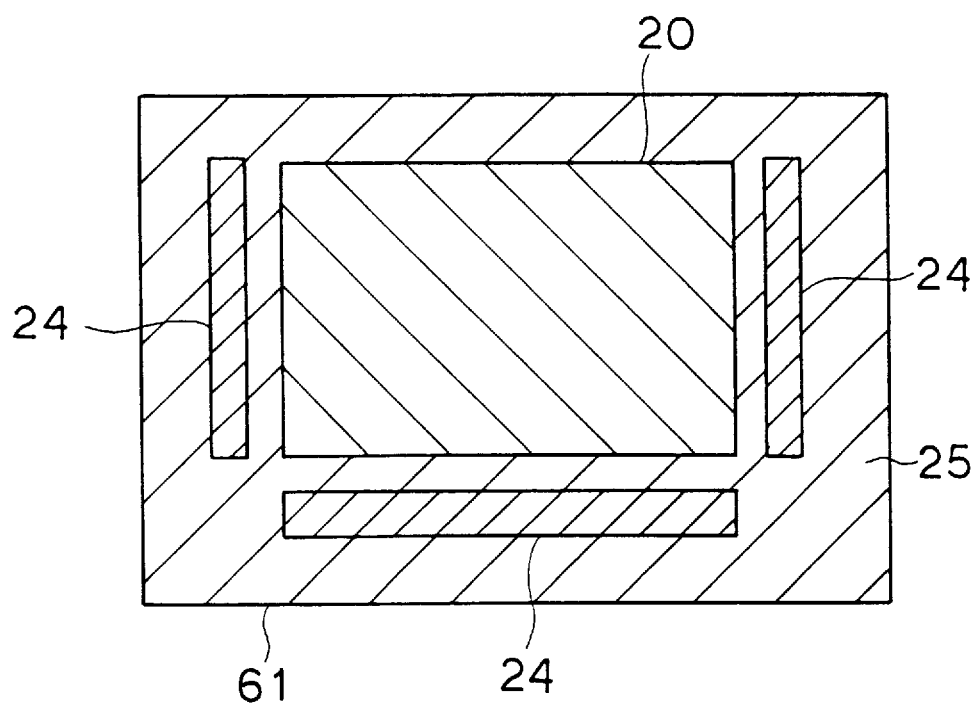
FIG. 46 is a plan view for describing ratios of heat absorption films in a pixel part, a peripheral driving circuit part, and the other region on a substrate.

FIG. 46 is a plan view for explaining ratios of heat absorption films in a pixel part, a peripheral driving circuit part, and the other region on a substrate. As described above, the heat absorption film is preferably provided uniformly over the whole substrate 61. In the pixel part 20, the heat absorption film is preferably provided in area of 0.01 to 60%, further preferably 10 to 50% of the whole circuit area. In the peripheral driving circuit part 24, the heat absorption film is preferably provided in area of 0.01 to 60%, further preferably 10 to 50% of the whole circuit area. In the region 25 other than the pixel part 20 and the peripheral driving circuit part 24, the heat absorption film is preferably provided in area of 0.01 to 60%, further preferably 10 to 50% of the whole area.

In place of changing the areas of the W silicide films 62, the thicknesses may be changed.

The aforementioned embodiment can be modified as follows, to attain functions and effects similar to the above:

1) In place of the W silicide film 62, a semiconductor film such as an amorphous silicon film or a polycrystalline silicon film is employed. Such a silicon film may be doped with an impurity. When a conductive or semiconductor film is employed and a voltage is applied to this heat absorption film, the TFT can be driven as a four-terminal device similarly to a MOS transistor which is applied to an LSI for controlling the threshold voltage. When a glass substrate is employed, on the other hand, the transistor can be electrostatically shielded against ions which are present in the substrate, and prevented against deterioration of characteristics caused by the ions in the glass substrate and from a bad influence exerted by potentials formed by movable ions.

2) In place of the W silicide film 62, a film of high melting point metal silicide such as $MoSi_2$, $TiSi_2$, $TaSi_2$ or $CoSi_2$, or a high melting point metal such as W, Mo, Co, Cr, Ti or Ta may be employed. When the employed temperature is low (not more than about 450° C.), the so-called low melting point metal such as Al or Au may be employed.

Such a metal film (including the W silicide film) has a property of transmitting no light, whereby the following effects are attained:

a) The film prevents scattering of light and shields the liquid crystal cell against unnecessary light obliquely entering the same, whereby the contrast of the LCD device is improved.

b) The film shields the TFT against light entering the same, whereby a leakage current caused by the light is reduced for improving the characteristics of the TFT, while deterioration of the TFT itself caused by the light is prevented.

3) In the step 4, the amorphous silicon film 64a is deposited by low pressure CVD with monosilane gas, for example, at a temperature of 580° C. Thus, the amorphous silicon film 64a contains microcrystals.

When an amorphous silicon film containing microcrystals is polycrystallized by solid-phase crystallization, the crystal growth can be completed in a short time although the mobility is slightly reduced due to the reduction of the crystal grain sizes.

4) In the step 4, the amorphous silicon film is formed not by low pressure CVD or plasma CVD but by any one of a group consisting of normal pressure CVD, photoexcitation CVD, vapor deposition, EB (electron beam) deposition, MBE (molecular beam epitaxy), and sputtering.

5) A portion of the polycrystalline silicon film 64 corresponding to a channel region is doped with an impurity, for controlling the threshold voltage (Vth) of the polycrystalline silicon TFT. In a polycrystalline silicon TFT formed by solid-phase crystallization, the threshold voltage tends to shift in a depression direction in case of an N-channel transistor, or in an enhancement direction in case of a P-channel transistor. This tendency further remarkably appears when hydrogenation is performed. In order to suppress such shifting of the threshold voltage, the channel region may be doped with an impurity.

6) The step 5 is replaced with the following step:

Step 5a: A heat treatment is performed in an electric furnace in a nitrogen ($N_2$) atmosphere at a temperature of about 600° C. for about 20 hours, thereby forming the polycrystalline silicon film 64 by solid-phase crystallization of the amorphous silicon film 64a.

7) In the polycrystalline silicon film 64 formed in the step 5a, a number of defects such as dislocations are present in crystals forming the film while amorphous parts may remain between the crystals, to result in a high leakage current.

After the step 5a, therefore, the substrate 61 is rapidly heated by RTA or laser annealing, for improving the film quality of the polycrystalline silicon film 64.

8) In the step 1 or 7, the W silicide film 62 or 66b is formed by PVD such as vacuum deposition, ion plating, ion beam deposition, a cluster ion beam method or the like, in place of sputtering. Also in this case, the composition of W silicide ($WSi_x$) is set at X>2 for a reason similar to that for the aforementioned sputtering.

9) In the step 1 or 7, the W silicide film 62 or 66b is formed by CVD. The source gas therefor may be prepared from tungsten hexafluoride ($WF_6$) and silane ($SiH_4$). The film forming temperature is set at about 350° to 450° C. Also in this case, the composition of W silicide ($WSi_x$) is set at X>2 for a reason similar to that for the aforementioned sputtering. The CVD is superior in step coverage to the PVD, whereby the thickness of the W silicide film can be further homogenized.

10) The present invention is applied to not only to a planar type TFT but polycrystalline silicon TFTs of all structures such as reverse-planar, stagger and reverse-stagger type TFTs.

11) The present invention is applied not only to a polycrystalline silicon TFT but to general insulated gate semiconductor devices. Further, the present invention is applied to all semiconductor devices employing polycrystalline silicon films such as photoelectric conversion elements such as a solar cell and an optical sensor, a bipolar transistor, a static induction transistor (SIT) and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device being formed by integrating a plurality of semiconductor elements and a substrate, said semiconductor device comprising:

each said semiconductor element has a heat absorption film provided between said substrate and said semiconductor elements, and an area or film thickness of said heat absorption film is relatively reduced in a portion where a relatively large number of said semiconductor elements are provided, while an area or film thickness of said heat absorption film is relatively increased in a portion where a relatively small number of said semiconductor elements are provided, in accordance with a distributed state of said semiconductor elements on said substrate.

2. A semiconductor device being formed by integrating a plurality of semiconductor switching elements on a substrate, each said semiconductor switching element comprising:

a heat absorption film being formed on said substrate;

an insulating film formed on said heat absorption film:

a semiconductor film being formed on said insulating film;

a gate electrode being formed on said semiconductor film through a gate insulating film; and an impurity region being formed in said semiconductor film;

wherein an area or film thickness of said heat absorption film is relatively reduced in a portion where a relatively large number of said semiconductor elements are provided, while an area or film thickness of said heat absorption film is relatively increased in a portion where a relatively small number of said semiconductor elements are provided, in accordance with the distributed state of said semiconductor elements on said substrate.

3. The semiconductor device in accordance with claim 1, wherein said area or film thickness of said heat absorption film is so adjusted that heat absorption of said absorption film functions substantially uniformly on said whole substrate.

4. The semiconductor device in accordance with claim 1, wherein said heat absorption film is made of a conductive material such as a metal or metal silicide, or a semiconductor material such as silicon.

5. A semiconductor device being formed by integrating a plurality of semiconductor elements on a substrate, said plurality of semiconductor elements comprising a plurality of first semiconductor elements each having a heat absorption film and a plurality of second semiconductor elements each not having a heat absorption film;

wherein said second semiconductor elements are relatively concentrated in a portion where a relatively large number of said semiconductor elements are provided, while said first semiconductor elements are relatively concentrated in a portion where a relatively small number of said semiconductor elements are provided, in accordance with the distributed state of said semiconductor elements on said substrate.

6. A driver-integrated display device having a pixel part and a peripheral driving circuit part being formed on the same substrate, said driver-integrated display device comprising:

a pixel driving element being provided in said pixel part; and a peripheral driving circuit element being provided in said peripheral driving circuit part; wherein said pixel driving element and said peripheral driving circuit element are formed by semiconductor switching elements, and each said semiconductor element comprises:

a heat absorption film being formed on said substrate, an insulating film formed on said heat absorption film:

a semiconductor film being formed on insulating film, a gate electrode being formed on said semiconductor film through a gate insulating film, and an impurity region being formed in said semiconductor film, a ratio of area or film thickness of said heat absorption film relative to said semiconductor film in said pixel part being adjusted to be larger than that of said heat absorption film in said peripheral driving circuit part.

7. The display device in accordance with claim 6, wherein said area of said heat absorption film in said pixel part is set to 0.01 to 60% of the whole area of said pixel part.

8. The display device in accordance with claim 6, wherein said area of said heat absorption film in said peripheral driving circuit part is set to 0.01 to 60% of the whole area of said peripheral driving circuit part.

9. The display device in accordance with claim 6, wherein said area of said heat absorption film in said substrate is set to 0.01 to 60% of the whole area of said substrate.

10. The display device in accordance with claim 6, wherein said substrate is one of a pair of substrates being opposed to each other through a liquid crystal layer.

11. The display device in accordance with claim 6, wherein each said heat absorption film is provided in a size and within an area substantially corresponding to a channel region of each said semiconductor film.

12. The display device in accordance with claim 6, wherein said heat absorption effect of each said heat absorption film is adjusted by changing the area or the thickness of said heat absorption film.

13. The display device in accordance with claim 6, wherein an insulating film is formed on each said heat absorption film.

14. The display device in accordance with claim 6, wherein each said heat absorption film is made of a conductive material such as a metal or metal silicide, or a semiconductor material such as silicon.

15. The display device in accordance with claim 6, wherein each said heat absorption film acts as a shade.

16. The display device in accordance with claim 6, wherein said substrate is a transparent substrate.

17. The display device in accordance with claim 6, wherein RTA employing a xenon arc lamp as a heat source is employed as said heat treatment.

18. A display device being formed by integrating a plurality of semiconductor elements on a substrate, said plurality of semiconductor elements comprising a plurality of first semiconductor elements each having a heat absorption film and a plurality of second semiconductor elements each not having a heat absorption film;

wherein said second semiconductor elements are relatively concentrated in a portion where a relatively large number of said semiconductor elements are provided, while said first semiconductor elements are relatively concentrated in a portion where a relatively small number of said semiconductor elements are provided, in accordance with the distributed state of said semiconductor elements on said substrate.

* * * * *